(12) United States Patent
Yamada

(10) Patent No.: US 12,336,358 B2
(45) Date of Patent: Jun. 17, 2025

(54) DISPLAY DEVICE AND MANUFACTURING METHOD OF THE DISPLAY DEVICE

(71) Applicant: Japan Display Inc., Tokyo (JP)

(72) Inventor: Kazuyuki Yamada, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 390 days.

(21) Appl. No.: 17/736,098

(22) Filed: May 4, 2022

(65) Prior Publication Data

US 2022/0262853 A1     Aug. 18, 2022

Related U.S. Application Data

(63) Continuation of application No. PCT/JP2020/038715, filed on Oct. 14, 2020.

(30) Foreign Application Priority Data

Dec. 10, 2019  (JP) ................. 2019-222777

(51) Int. Cl.
| | | |
|---|---|---|
| *H01L 27/15* | (2006.01) | |
| *H10H 20/01* | (2025.01) | |
| *H10H 20/814* | (2025.01) | |
| *H10H 20/857* | (2025.01) | |
| *H10H 29/14* | (2025.01) | |

(52) U.S. Cl.
CPC .......... *H10H 29/142* (2025.01); *H10H 20/01* (2025.01); *H10H 20/814* (2025.01); *H10H 20/857* (2025.01); *H10H 20/0364* (2025.01)

(58) Field of Classification Search
CPC ..... H01L 27/156; H01L 33/005; H01L 33/10; H01L 33/62; H01L 33/60; H01L 25/0753; G09F 9/00; G09F 9/33
See application file for complete search history.

(56) References Cited

U.S. PATENT DOCUMENTS

| | | | |
|---|---|---|---|
| 2007/0052636 A1* | 3/2007 | Kalt ..................... | G09G 3/34 345/83 |
| 2014/0203310 A1* | 7/2014 | Fujii ..................... | G09F 9/33 257/89 |

(Continued)

FOREIGN PATENT DOCUMENTS

| | | |
|---|---|---|
| JP | 2003-272871 A | 9/2003 |
| JP | 2014-137582 A | 7/2014 |

(Continued)

OTHER PUBLICATIONS

International Search Report and Written Opinion mailed on Dec. 22, 2020, received for PCT Application PCT/JP2020/038715, Filed on Oct. 14, 2020, 12 pages including English Translation.

(Continued)

*Primary Examiner* — Jarrett J Stark
(74) *Attorney, Agent, or Firm* — XSENSUS LLP

(57) ABSTRACT

Disclosed is a display device including a substrate, a plurality of pixels, a counter substrate, and at least one rib. The plurality of pixels is located over the substrate and each includes a light-emitting diode. The counter substrate is located over the plurality of pixels. The at least one rib is formed over the counter substrate, located over a region between the plurality of light-emitting diodes included in the plurality of pixels, and has a height larger than a height of the light-emitting diode.

14 Claims, 19 Drawing Sheets

(56) References Cited

U.S. PATENT DOCUMENTS

| | | | |
|---|---|---|---|
| 2016/0072012 A1* | 3/2016 | Chen | H01L 33/44 |
| | | | 257/101 |
| 2016/0372514 A1* | 12/2016 | Chang | H01L 27/1259 |
| 2017/0010516 A1* | 1/2017 | Shiota | G02F 1/133512 |
| 2017/0337870 A1* | 11/2017 | Lin | H01L 25/0753 |
| 2018/0342654 A1 | 11/2018 | Chen | |
| 2020/0105824 A1* | 4/2020 | Dimitropoulos | H01L 33/0075 |
| 2020/0105972 A1* | 4/2020 | Dimitropoulos | H01L 33/06 |
| 2021/0005790 A1* | 1/2021 | Hsiang | H01L 33/54 |
| 2021/0183957 A1* | 6/2021 | Zhang | G06F 3/04164 |
| 2021/0265540 A1* | 8/2021 | Itou | H01L 33/62 |
| 2021/0332967 A1* | 10/2021 | Yueh | H01L 33/58 |
| 2022/0005791 A1* | 1/2022 | Yu | H01L 25/0753 |
| 2022/0059607 A1* | 2/2022 | Murugan | H01L 25/0753 |
| 2022/0077229 A1* | 3/2022 | Yu | H01L 27/156 |
| 2022/0113550 A1* | 4/2022 | Yueh | G02B 5/003 |
| 2022/0140184 A1* | 5/2022 | Zeng | H01L 25/0753 |
| | | | 257/79 |
| 2022/0186912 A1* | 6/2022 | Yueh | G02F 1/133603 |
| 2022/0262853 A1* | 8/2022 | Yamada | G09F 9/33 |
| 2022/0285581 A1* | 9/2022 | Hong | H01L 25/0753 |
| 2022/0352428 A1* | 11/2022 | Choi | H01L 25/0753 |
| 2023/0022736 A1* | 1/2023 | Tanaka | H01L 33/60 |
| 2023/0039821 A1* | 2/2023 | Shimizu | F21S 41/663 |
| 2023/0087411 A1* | 3/2023 | Niu | H01L 31/14 |
| | | | 257/40 |
| 2023/0102283 A1* | 3/2023 | Yu | H01L 33/483 |
| | | | 257/91 |
| 2023/0317696 A1* | 10/2023 | Wu | H01L 25/167 |
| | | | 257/97 |
| 2024/0194841 A1* | 6/2024 | Zheng | H01L 33/62 |

FOREIGN PATENT DOCUMENTS

| | | |
|---|---|---|
| JP | 2016-136176 A | 7/2016 |
| WO | 2012/081536 A1 | 6/2012 |

OTHER PUBLICATIONS

Office Action issued Aug. 29, 2023 in Japanese Patent Application No. 2019-222777, 7 pages. (Submitting English translation only.).

* cited by examiner

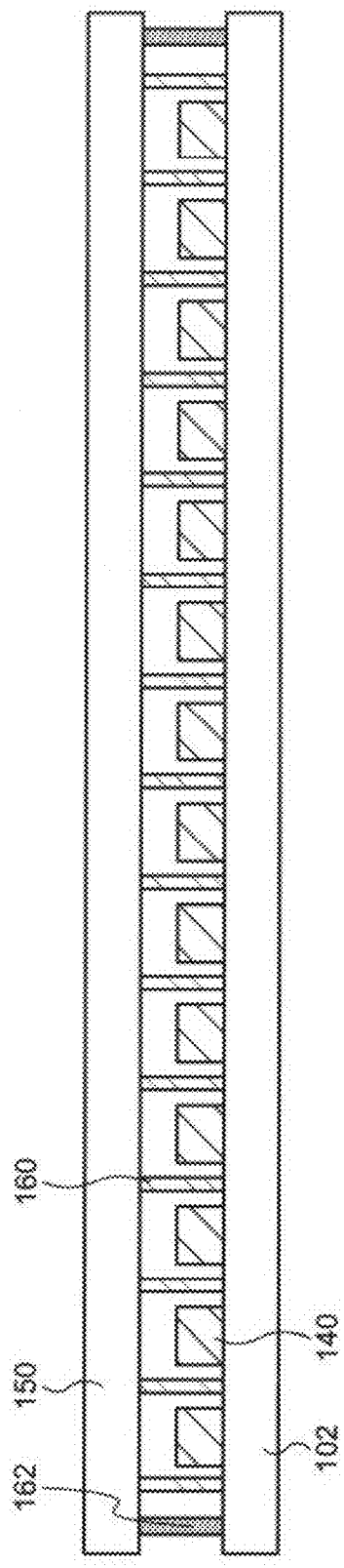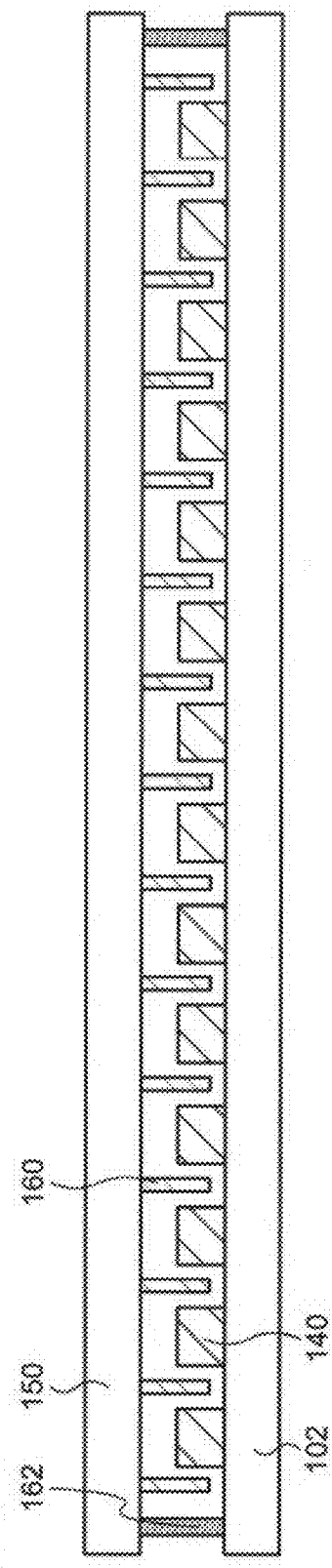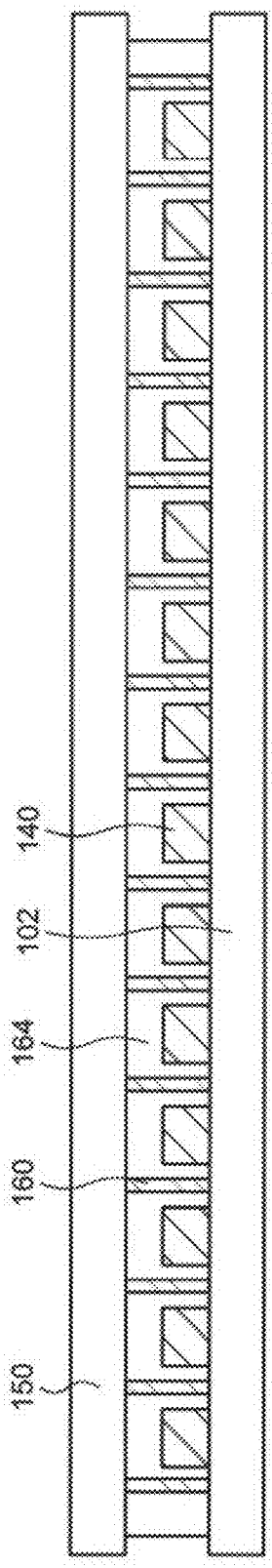

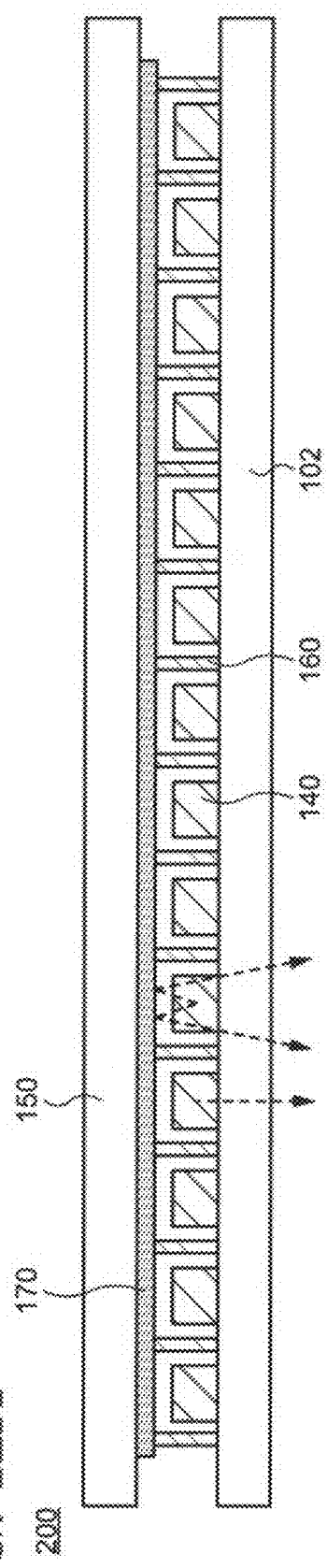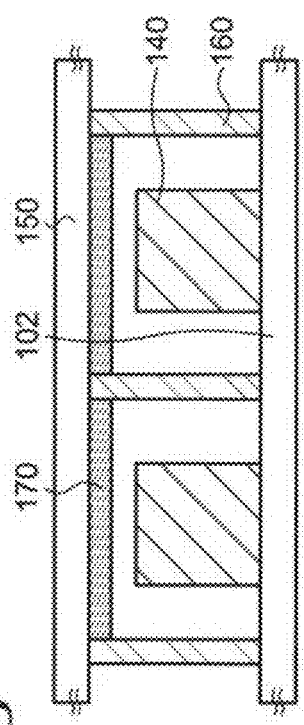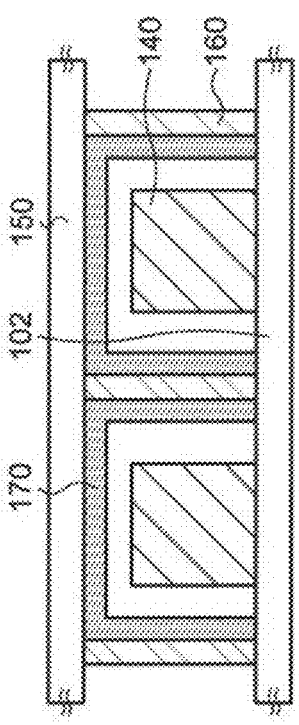
FIG. 12A
FIG. 12B
FIG. 12C

DISPLAY DEVICE AND MANUFACTURING METHOD OF THE DISPLAY DEVICE

CROSS-REFERENCE TO RELATED APPLICATIONS

This application is a Continuation of International Patent Application No. PCT/JP2020/038715, filed on Oct. 14, 2020, which claims the benefit of priority to Japanese Patent Application No. 2019-222777, filed on Dec. 10, 2019, the entire contents of which are incorporated herein by reference.

FIELD

An embodiment of the present invention relates to a display device and a manufacturing method thereof.

BACKGROUND

As an example of display devices, LED display devices in which one or a plurality of light-emitting diodes (LEDs) is provided in each of a plurality of pixels arranged over a substrate have been known. The LED devices are expected as a new type of a self-emission display device because they are capable of displaying images with high visibility, because display devices having arbitral shapes and sizes can be produced, and because LEDs have higher reliability than an organic light-emitting diode (OLED) (see, US Patent Application Publication No. 2018/0342654, for example).

SUMMARY

An embodiment of the present invention is a display device. The display device includes a substrate, a plurality of pixels, a counter substrate, and at least one rib. The plurality of pixels is located over the substrate and each includes a light-emitting diode. The counter substrate is located over the plurality of pixels. The at least one rib is sandwiched by the substrate and the counter substrate, is located over a region between the light-emitting diodes included in the plurality of pixels, and has a height larger than a height of the light-emitting diode.

An embodiment of the present invention is a method for manufacturing a display device. This method includes: forming a wiring over a substrate; forming, over the substrate, a light-emitting diode electrically connected to the wiring; forming, over a counter substrate, at least one rib having an opening; and fixing the substrate and the counter substrate to each other so that the light-emitting diode and the opening overlap each other and the at least one rib is sandwiched by the substrate and the counter substrate.

An embodiment of the present invention is a method for manufacturing a display device. This method includes: forming a wiring over a substrate; forming, over the substrate, a light-emitting diode electrically connected to the wiring; forming, over a counter substrate, a plurality of ribs arranged in a stripe form or an island form; and fixing the substrate and the counter substrate to each other so that the light-emitting diode overlaps a region between the ribs adjacent to each other and the plurality of ribs is sandwiched by the substrate and the counter substrate.

DESCRIPTION OF DRAWINGS

FIG. 9A to FIG. 9C are schematic cross-sectional views of a display device according to an embodiment of the present invention.

FIG. 12A to FIG. 12C are schematic cross-sectional views of a display device according to an embodiment of the present invention.

DESCRIPTION OF EMBODIMENTS

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

First Embodiment

In the present embodiment, a structure of a display device 100 according to an embodiment of the present invention is explained.

1. Outline Structure

Figure 1:
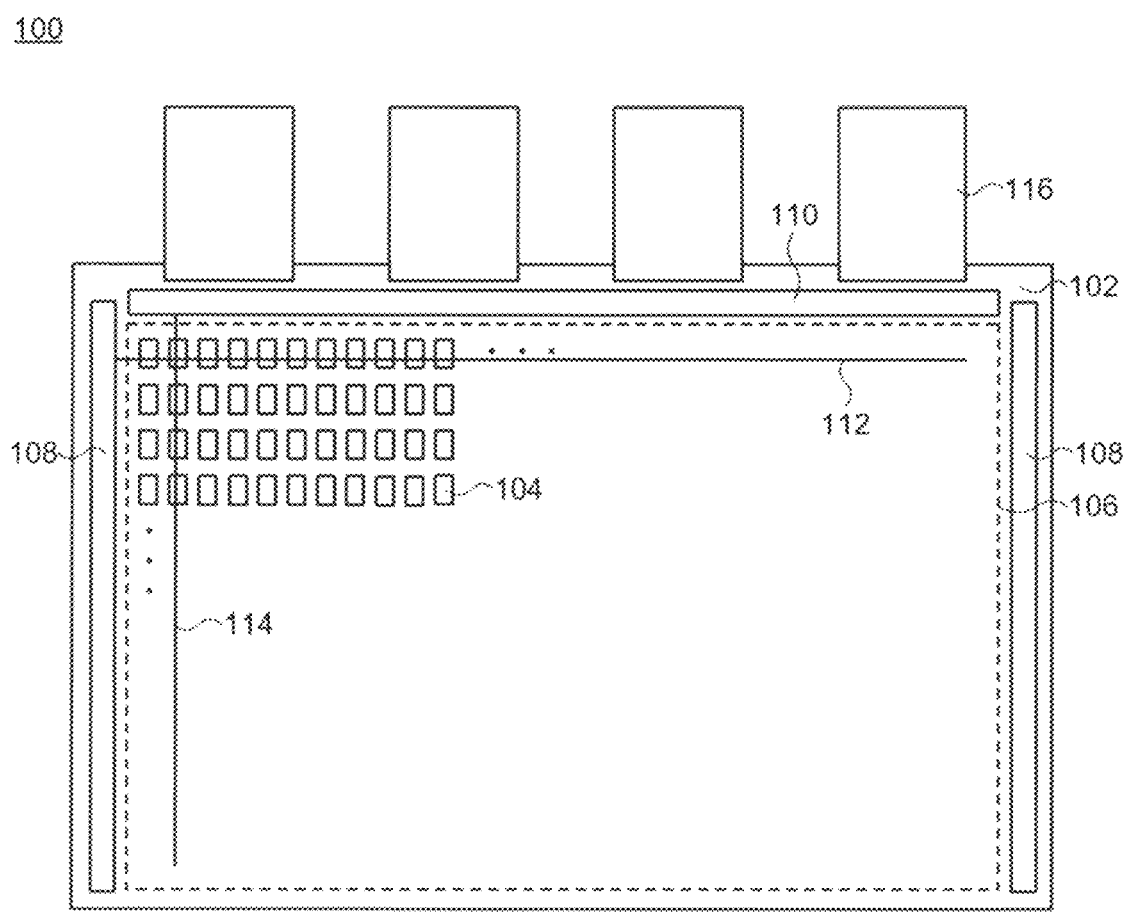
FIG. 1 is a schematic top view of a display device according to an embodiment of the present invention.

A schematic top view of the display device 100 is shown in FIG. 1. The display device 100 has a substrate 102, and a variety of patterned conductive films and insulating films is stacked over the substrate 102.

The substrate 102 includes a material having high transmissivity with respect to visible light and is configured to transmit the emission from LEDs 140 described below. More specifically, the substrate 102 includes a material selected from glass, quartz, and a polymer such as a polyimide, a polyamide, a polyester exemplified by poly(ethylene terephthalate) and poly(naphthalene terephthalate), and a polycarbonate including an aromatic ring in a main chain. The substrate 102 may have flexibility.

Patterned conductive films, insulating films, and semiconductor films are appropriately arranged over the substrate 102, thereby structuring a plurality of pixels 104 each including a pixel circuit, driver circuits (scanning-line driver circuits 108 and signal-line driver circuit 110) for driving the plurality of pixels 104, a plurality of first wirings 112 and second wirings 114 functioning as wirings for supplying current from the driver circuits to each pixel 104, a plurality of terminals (not illustrated) connected to the pixels 104 and the driver circuits, and the like. A circuit substrate 116 such as a flexible printed circuit (FPC) substrate is connected to the plurality of terminals, and power source and image signals are supplied to the display device 100 from an external circuit which is not illustrated through the circuit substrate 116. The pixel 104 is disposed at a cross point or a vicinity thereof of the first wiring 112 and the second wiring 114, and current is supplied to the pixel circuit of each pixel 104 through the first wiring 112 and the second wiring 114. With this structure, an image is displayed in a display region 106 defined by the plurality of pixels 104. The arrangement of the pixels 104 is also not limited, and the stripe arrangement demonstrated in FIG. 1, a Delta arrangement, and the like may also be employed. Here, the pixel 104 is a minimum unit providing color information and is a region including the LED 140 (described below) as well as the pixel circuit for driving the LED 140. The display region is a single region surrounding all of the pixels and having a minimum area.

The display device 100 may be an active-matrix type display device. In this case, the pixel circuit including one or a plurality of transistors and capacitor elements is formed in each pixel 104 with a stack of a variety of patterned conductive films, insulating films, and semiconductor films. In this case, the first wirings 112 correspond to the scanning signal lines supplying scanning signals to the transistors, while the second wirings 114 correspond to signal lines supplying signal voltages to the transistors. When the display device 100 is a passive-type display device, the first wirings 112 are also called anode lines or cathode lines, and the second wirings 114 are similarly called cathode lines or anode lines. In addition, the scanning-line driver circuit 108 and the signal-line driver circuit 110 may not be provided, and the first wirings 112 and the second wirings 114 may be connected to the circuit substrate 116.

2. Pixel

Figure 2A:
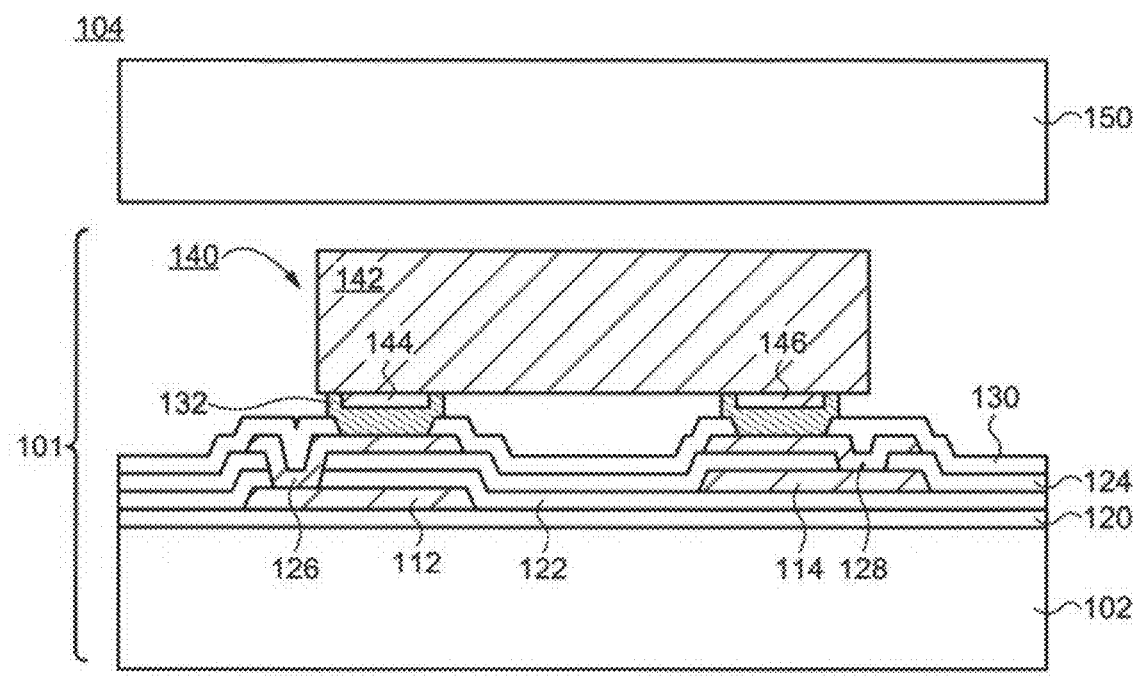
FIG. 2A and FIG. 2B are schematic cross-sectional views of a display device according to an embodiment of the present invention.

A schematic cross-sectional view of the pixel 104 is shown in FIG. 2A. The LED 140 is provided in each pixel 104. Hereinafter, the LED 140 is a current-drive-type light-emitting element and is configured by a stack 142 of a compound semiconductor including a Group 13 element and a Group 15 element such as indium, gallium, aluminum, nitrogen, and phosphorus and a pair of electrodes 144 and 146 electrically connected to the stack 142. More specifically, the stack 142 has a p-layer including a p-type compound semiconductor, an n-layer including a n-type compound semiconductor, and a pn-layer formed by the contact of the p-layer and the n-layer, and the pair of electrodes 144 and 146 is respectively connected to the p-layer and the n-layer. Direct current is supplied to the stack 142 from the pair of electrodes 144 and 146, and carriers are injected to an active layer through the p-layer and the n-layer. Recombination of carriers occurs in the active layer, and the energy obtained by the recombination is extracted as light.

There is no limitation to the emission color of the LED 140. As a typical example, one or a plurality of red, green, or blue-emissive LEDs 140 is arranged in each pixel 104 so that a plurality of red-emissive LEDs 140, a plurality of green-emissive LEDs 140, and a plurality of blue-emissive LEDs 140, which consist of the three primary colors, are arranged in the display device 100. When a plurality of LEDs 140 is disposed in one pixel 104, the LEDs 140 may be arranged so that the LEDs 140 give the same color in each pixel 104.

The size and the shape of the LED 140 are also not limited. An LED with a size equal to or more than several micrometers and equal to or less than 100 μm in a plane parallel to a main surface of the substrate 102 is called a micro-LED, and a LED with a size equal to or more than 100 μm is called a mini-LED. In the present embodiment, an LED with an arbitral size can be used, and a micro-LED or a mini-LED may be used according to the size of the pixel 104. More specifically, the shape of each LED 140 in a plane parallel to the main surface of the substrate 102 may be a polygon with a side equal to or more than 1 atm and equal to or less than 100 μm, equal to or more than 5 μm and equal to or less than 50 μm, or equal to or more than 10 μm and equal to or less than 20 μm. A height of each LED 140, that is, a length in a direction perpendicular to the main surface of the substrate 102, may be appropriately set in a region equal to or more than 1 μm and equal to or less than 100 μm, equal to or more than 5 μm and equal to or less than 50 μm, or equal to or more than 10 μm and equal to or less than 20 μm.

There is no limitation to the structure of the pixel circuit formed in each pixel 104. For example, the pixel circuit may be structured by the first wiring 112 formed over a passivation film 120 covering the substrate 102, the second wiring 114 formed over a first interlayer insulating film 122 located over the first wiring 112, leading terminals 126 and 128 electrically connected to the first wiring 112 and the second wiring 114, respectively, in openings formed in a second interlayer insulating film 124 covering the first wiring 112 and the second wiring 114, and the like as shown in FIG. 2A. Edge portions of the leading terminals 126 and 128 may be covered by a protective insulating film 130. The passivation film 120, the first interlayer insulating film 122, the second interlayer insulating film 124, and the protective insulating film 130 each include one or more films each including a silicon-containing inorganic compound such as silicon oxide and silicon nitride or an organic compound such as an epoxy resin, an acrylic resin, and a silicon resin. The first interlayer insulating film 122 is provided in order to electrically insulate the first wiring 112 and the second wiring 114.

The pair of electrodes 144 and 146 of the LED 140 is electrically connected to the leading terminals 126 and 128, respectively, with a conductive agent 132. The conductive agent 132 may include a paste including particles of a metal such as silver, copper, and nickel or a solder, or the like. The current supplied from the first wiring 112 and the second wiring 114 is supplied to the pair of electrodes 144 and 146 through the leading terminals 126 and 128 and the conductive agent 132. Note that the leading terminals 126 and 128 are optional structures, and the first wiring 112 and the second wiring 114 may be directly connected to the electrodes 144 and 146, respectively, through the conductive agent 132.

Figure 2B:
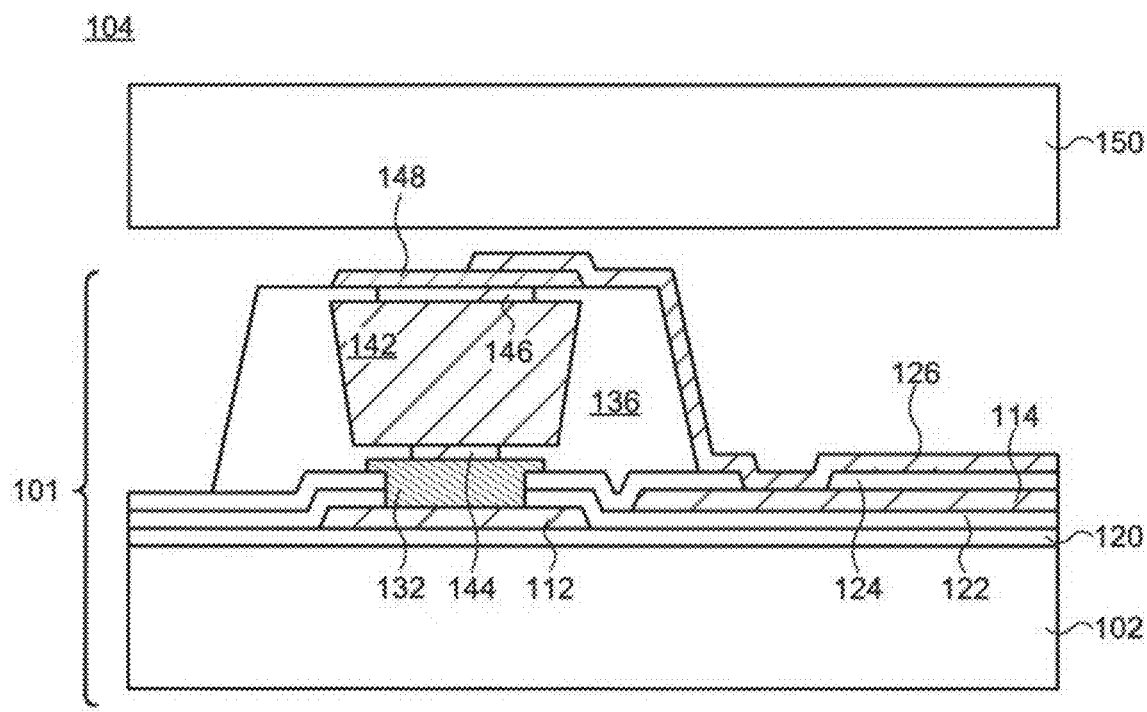

In the example shown in FIG. 2A, the pair of electrodes 144 and 146 is arranged on the same side with respect to the stack 142. However, the pair of electrodes 144 and 146 may be arranged to sandwich the stack 142 as shown in FIG. 2B. In this case, the LED 140 is fixed and sealed with a sealing film 136, for example, and one electrode 144 is electrically connected to the first wiring 112 with the conductive agent 132. The other electrode 146 is provided so as to be exposed from the sealing film 136 and is electrically connected to the leading terminal 126 (or 128) formed over the sealing film 136. The leading terminal 126 is further electrically connected to the second wiring 114 through the opening formed in the second interlayer insulating film 124.

A counter substrate 150 opposing the substrate 102 may be further provided to the display device 100. Similar to the substrate 102, the counter substrate 150 is also configured to transmit visible light and may include a material usable for the substrate 102. The counter substrate 150 protects the substrate 102 and the LED 140 as a cover glass. Furthermore, although not illustrated, a light-shielding film or a reflecting film may be disposed between the substrate 102 and the passivation film 120. The reflecting film may be provided between the substrate 102 and the passivation film 120 or between the substrate 102 and the LEDs 140. With this structure, the light from the LED 140 can be selectively extracted on the side of the counter substrate 150.

Hereinafter, the substrate 102, the LED 140, and the variety of insulating films and wirings formed therebetween are collectively referred to as a backplane 101. The display function which is a fundamental function of the display device 100 is realized by the backplane 101.

3. Rib

At least one rib 160 is further provided to the display device 100 to effectively extract the light from the LED 140. The rib 160 has a protruding shape such as a columnar member or a wall-shaped member, for example. The structure of the rib 160 is shown in a schematic top view (FIG. 3A) of a part of the display device 100 and a schematic cross-sectional view (FIG. 3B) along a chain line A-A' in FIG. 3A. Some components such as the pixel circuit and the insulating films are not illustrated in FIG. 3B for visibility.

As demonstrated in these drawings, the display device 100 includes at least one rib 160 having a plurality of openings 160a between the substrate 102 and the counter substrate 150. The rib 160 is fixed to the side of the counter substrate 150. Hence, the rib 160 is in direct contact with the counter substrate 150. Alternatively, when the structural members such as a light-shielding film 166 and an overcoat which are described below are formed, the rib 160 is in contact with at least one of these structural members. The rib 160 is formed so as not to overlap the pixels 104 and the LEDs 140. That is, the rib 160 is configured so that the plurality of openings 160a overlaps the pixels 104 or the LEDs 140 and extends over a region between the LEDs 140 of the adjacent pixels 104. A height of the rib 160 is adjusted to be larger than the height of the LED 140.

There is no limitation of the materials structuring the rib 160, and organic compounds exemplified by a polymer are represented, for example. As a polymer, an epoxy resin, an acrylic resin, a polyamide, a polyimide, a silicon resin, and the like are represented. When the rib 160 includes an organic compound, it is preferred that a refractive index of the rib 160 be relatively high. Specifically, it is preferred to use a material having a refractive index equal to or higher than 1.40 and equal to or lower than 1.80, equal to or higher than 1.40 and equal to or lower than 1.75, or equal to or higher than 1.50 and equal to or lower than 1.75. As a polymer with a high refractive index, a polymer including sulfur, halogen, or phosphorous is represented. As a polymer including sulfur, a polymer including a substituent such as a thioether, a sulfone, a thiophene, or the like in a main chain or a side chain is represented. As a polymer including phosphorous, a polymer including a phosphite group, a phosphate group, or the like in a main chain or a side chain and a polyphosphazene are represented. As a polymer including halogen, a polymer including bromine, iodine, or chlorine as a substituent in a main chain or a side chain is represented. These polymers may be intermolecularly or intramolecularly crosslinked.

Alternatively, the rib 160 may include a metal. Aluminum, copper, silver, magnesium, titanium, molybdenum, tungsten, and the like are represented as a metal, for example, where aluminum or an alloy including aluminum having a high reflectance with respect to visible light is particularly preferred.

Alternatively, the rib 160 may include the aforementioned organic compound and further have a metal film covering a wall surface of the rib 160. As a metal included in the metal film, the aforementioned metals are exemplified.

The emission from the LEDs 140 can be efficiently extracted by forming the rib 160 with the aforementioned structure. This effect is explained using FIG. 3B. Since the light from the LED 140 is almost isotropically emitted from the active layer, the whole of the emitted light does not necessarily proceed in the light-extraction direction (toward the counter substrate 150 side in FIG. 3B). For example, not only does the light directly strike the counter substrate 150 but light is also radiated in a diagonal direction with respect to the main surface of the substrate 102 (see dotted arrow in FIG. 3B). However, the formation of the rib 160 allows the light to reflect on the surface of the rib 160, which enables not only the light directly incident on the counter substrate 150 but also the light radiating diagonally to the normal line of the main surface to proceed toward the side of the counter substrate 150. For example, when the rib 160 includes an organic compound, the light undergoes Fresnel reflection at the surface of the rib 160 due to the difference between the refractive index of the organic compound and the refractive index of the air or inert gas charged in the space in which the LEDs 140 are arranged. In the case where the rib 160 includes a metal or the surface of the rib 160 is covered with a metal, the light from the LED 140 is more efficiently reflected because of the high reflectance of the metal.

Accordingly, the light from the LED 140 can be effectively applied to the counter substrate 150, and an apparent light-extraction efficiency of each LED 140 is increased, which enables it to display high-luminance images and simultaneously contributes to the reduction of power consumption of the display device 100.

4. Shape and Arrangement of Lib

Figure 3A:
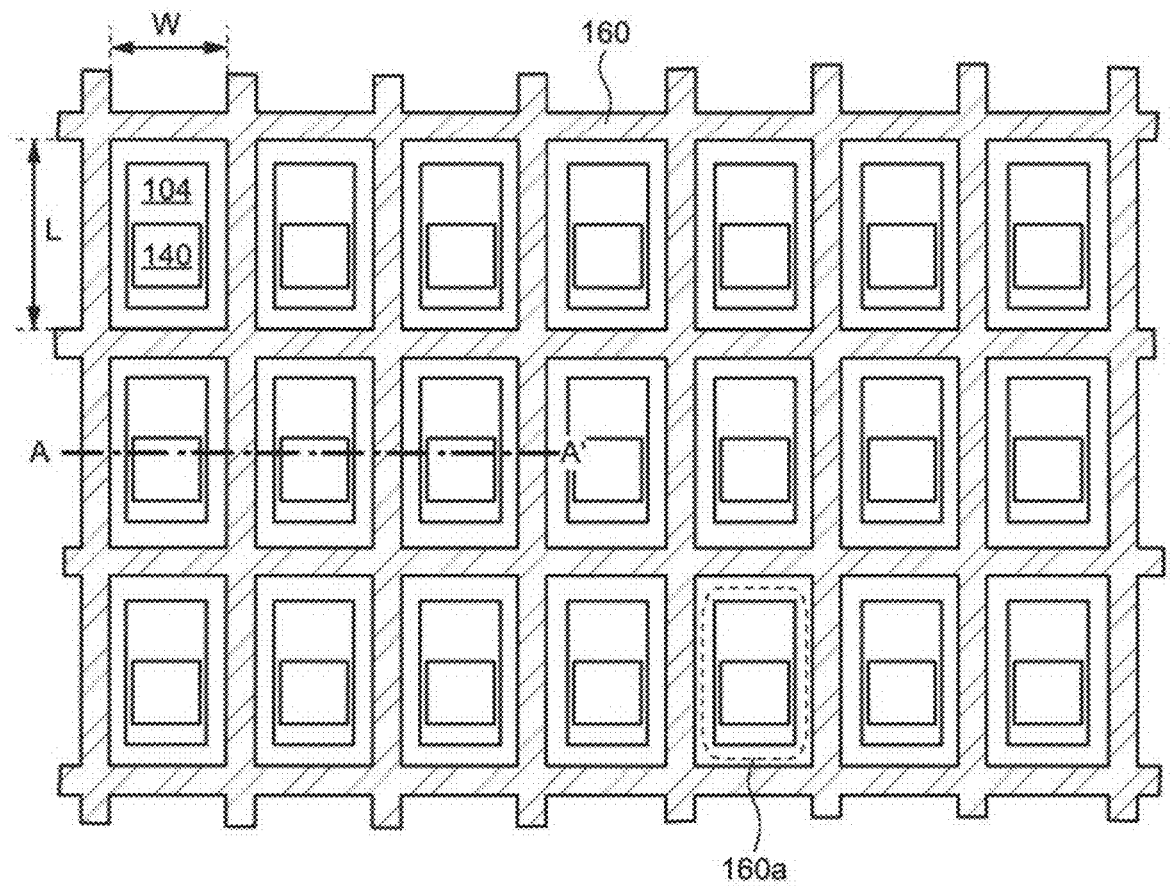
FIG. 3A and FIG. 3B are respectively schematic top and cross-sectional views of a display device according to an embodiment of the present invention.
Figure 4A:
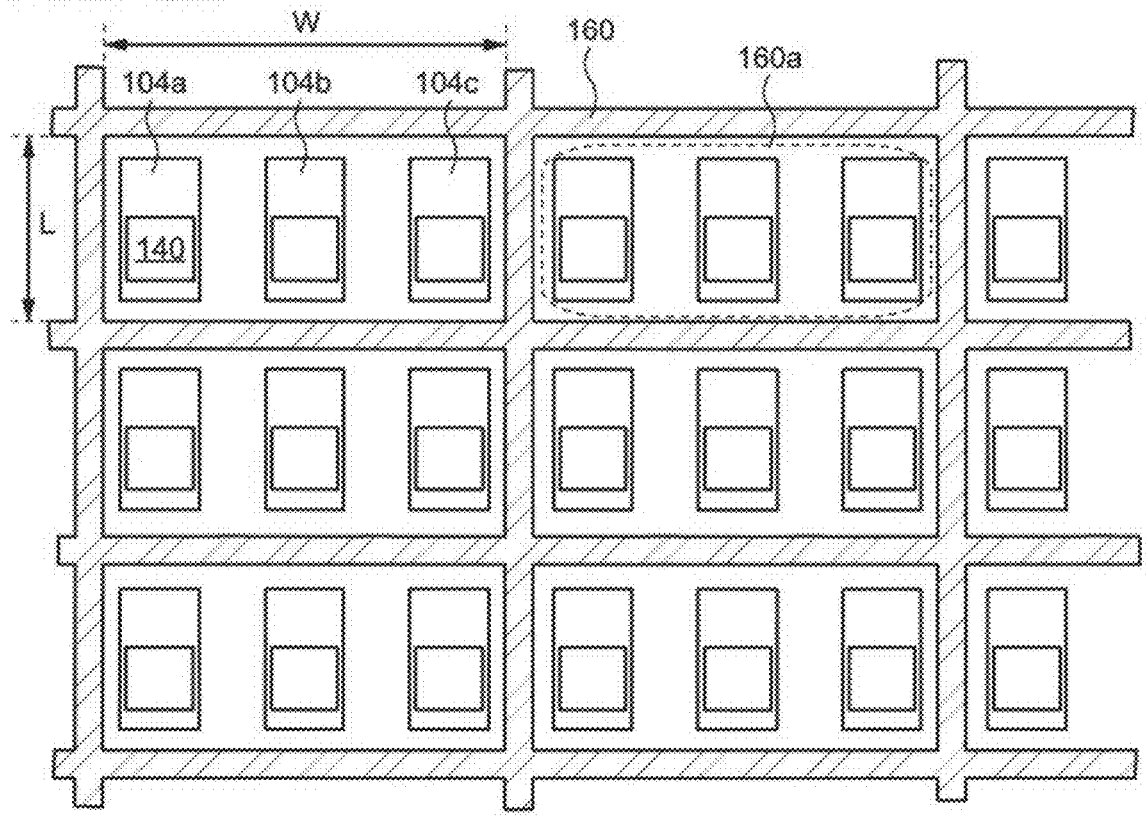
FIG. 4A and FIG. 4B are schematic top views of a display device according to an embodiment of the present invention.

The plane shape of the rib 160 is not limited to the shape shown in FIG. 3A. The rib 160 may be configured so that each of the plurality of openings 160a overlaps the LED 140 included in one pixel 104 as shown in FIG. 3A or may be configured so that a plurality of pixels 104 or a plurality of LEDs 140 included in a plurality of pixels 104 overlaps one opening 160a as shown in FIG. 4A. In the example illustrated in FIG. 4A, the rib 160 is configured so that three pixels 104a, 104b, and 104c overlap one opening 160a. In this case, the emission colors of the LEDs 140 arranged in these three pixels 104a, 104b, and 104c may be different from one another. For example, red, green, and blue-emissive LEDs 140 may be respectively arranged in the pixels 104a, 104b, and 104c.

Figure 4B:
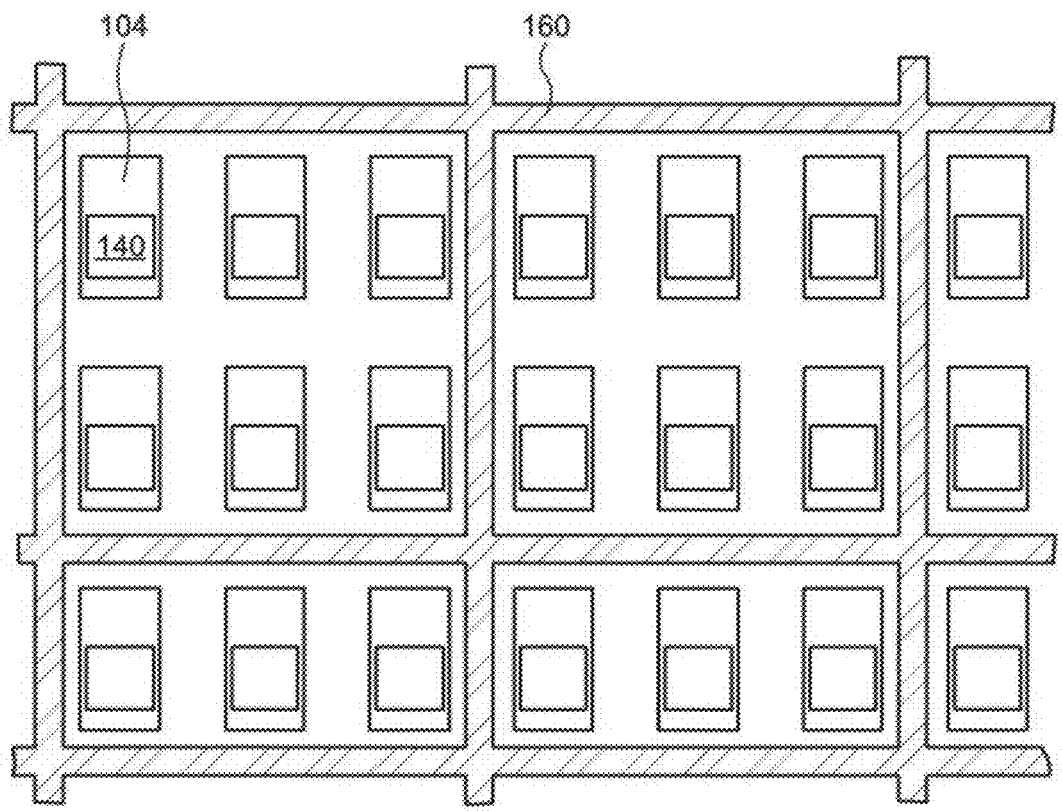

Areas, widths W, or lengths L of the plurality of openings 160a may be the same in the whole of the display region 106 or may be different depending on a position in the display region 106. Therefore, the number of the pixels 104 arranged in the openings 160a may be different from one another depending on the position of the display region 106 as shown in FIG. 4B. Here, the width W and the length L of the opening 160a are respectively the lengths of the opening 160a in the directions parallel to the first wiring 112 and the second wiring 114 or the lengths of the opening 160a in the directions parallel to the second wiring 114 and the first wiring 112 (see FIG. 4A).

Figure 5A:
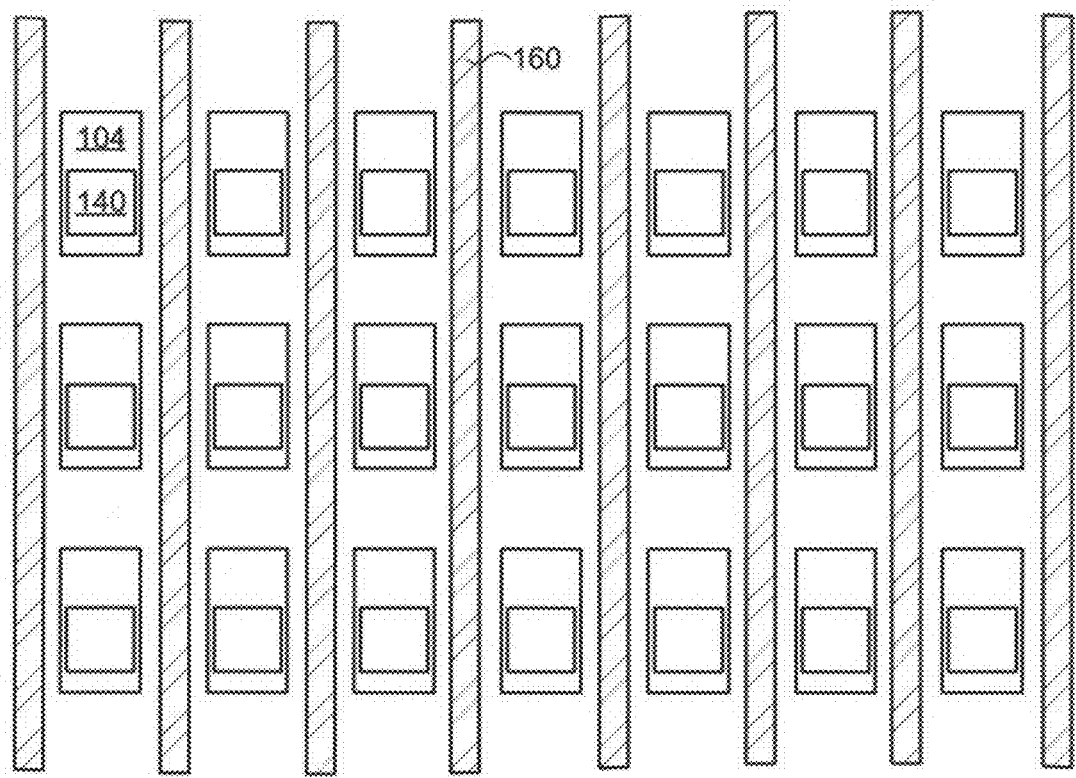
FIG. 5A and FIG. 5B are schematic top views of a display device according to an embodiment of the present invention.
Figure 5B:
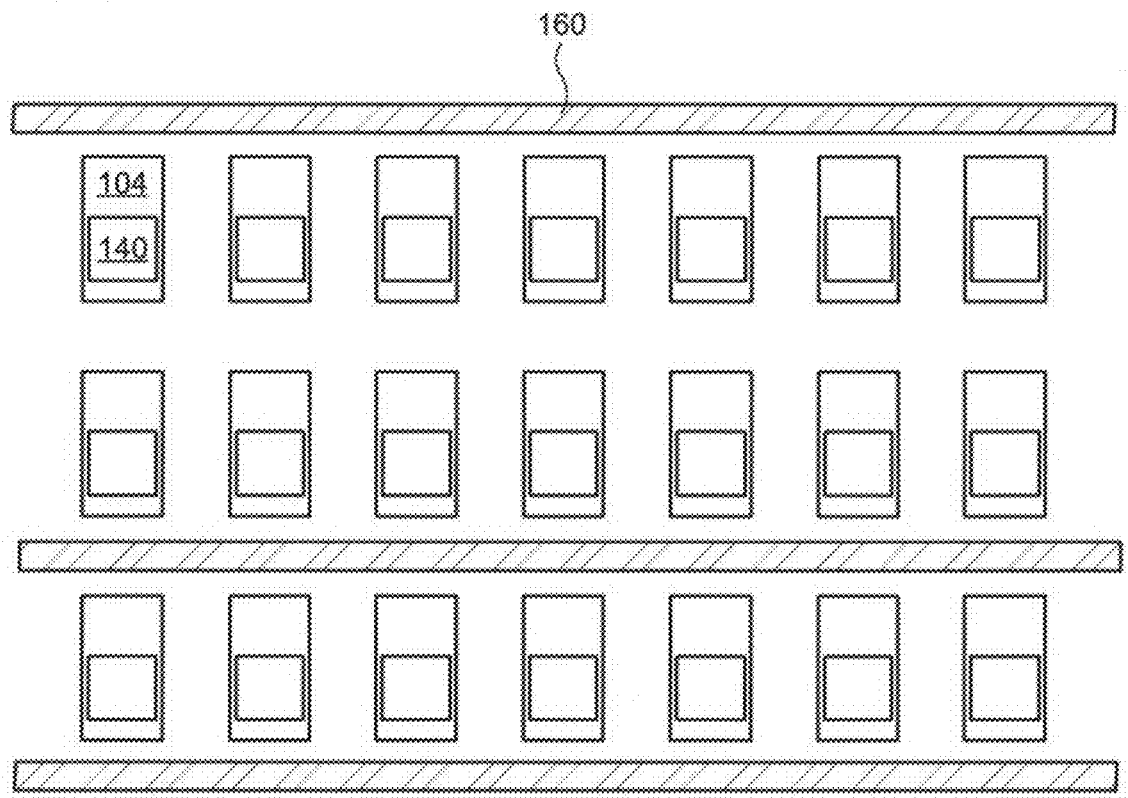

Although the display device 100 includes one rib 160 having the plurality of openings 160a in the examples shown in FIG. 3A, FIG. 4A, and FIG. 4B, the display device 100 may include a plurality of ribs 160 arranged in a stripe form (FIG. 5A). In this case, each rib 160 may be arranged parallel to the first wiring 112 or the second wiring 114. Furthermore, the plurality of pixels 104 may be arranged in one column (or one line) (FIG. 5A) or in a plurality of columns (or a plurality of lines) in a region between the adjacent ribs 160 (FIG. 5B). In addition, the number of columns (or lines) of the pixels 104 arranged in a region between a pair of adjacent ribs 160 may be different from the number of columns (or lines) of the pixels 104 arranged in a region between another pair of adjacent ribs 160 as shown in FIG. 5B.

Figure 6A:
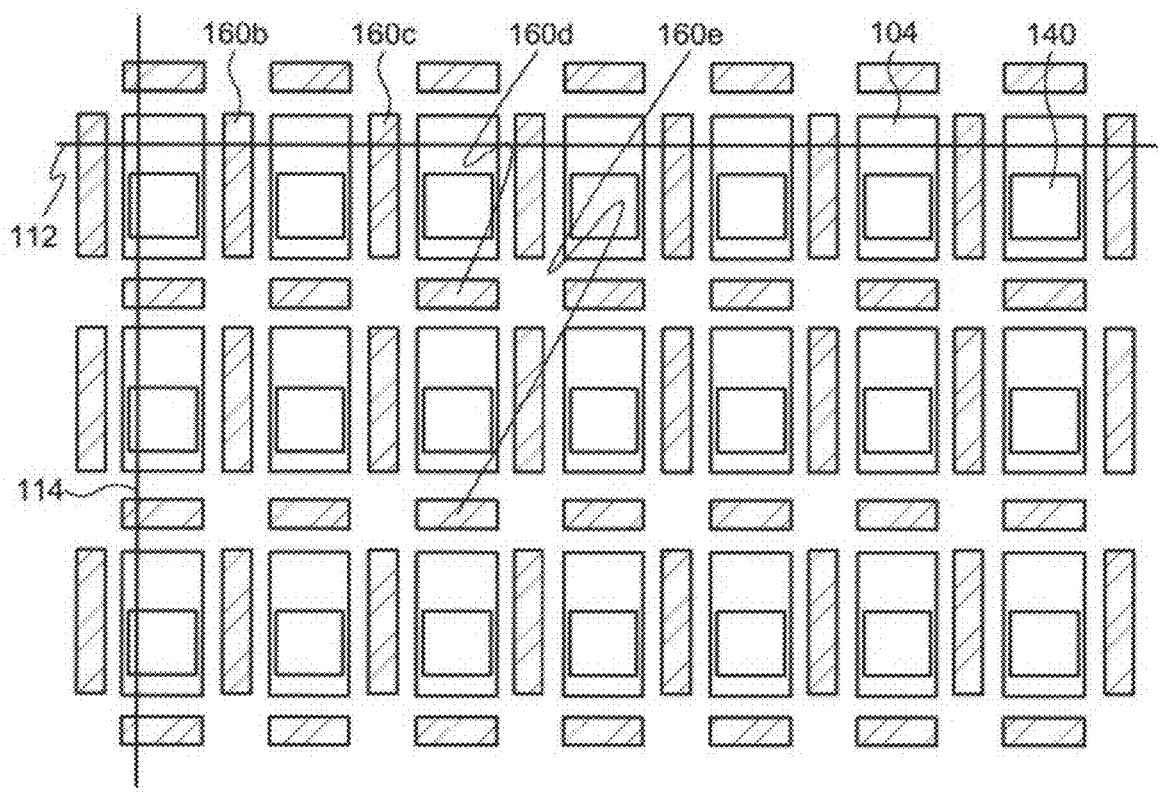
FIG. 6A and FIG. 6B are schematic top views of a display device according to an embodiment of the present invention.

Alternatively, the display device 100 may include a plurality of ribs 160 arranged in an island form as shown in FIG. 6A. In this case, each rib 160 is formed to extend in a direction parallel to the first wiring 112 or the second wiring 114. There is no limitation to the number of pixels 104 arranged in a region between the adjacent ribs 160. In a region between the ribs 160b and 160c adjacent to each other in the extending direction of the first wiring 112, only one pixel 104 may be arranged as shown in FIG. 6A or a plurality of pixels 104 may be arranged although not illustrated. Similarly, in a region between the ribs 160d and 160e adjacent to each other in the extending direction of the second wiring 114, one or a plurality of ribs 160 may be arranged. Note that only one first wiring 112 and one second wiring 114 are illustrated in FIG. 6A for visibility.

Figure 6B:
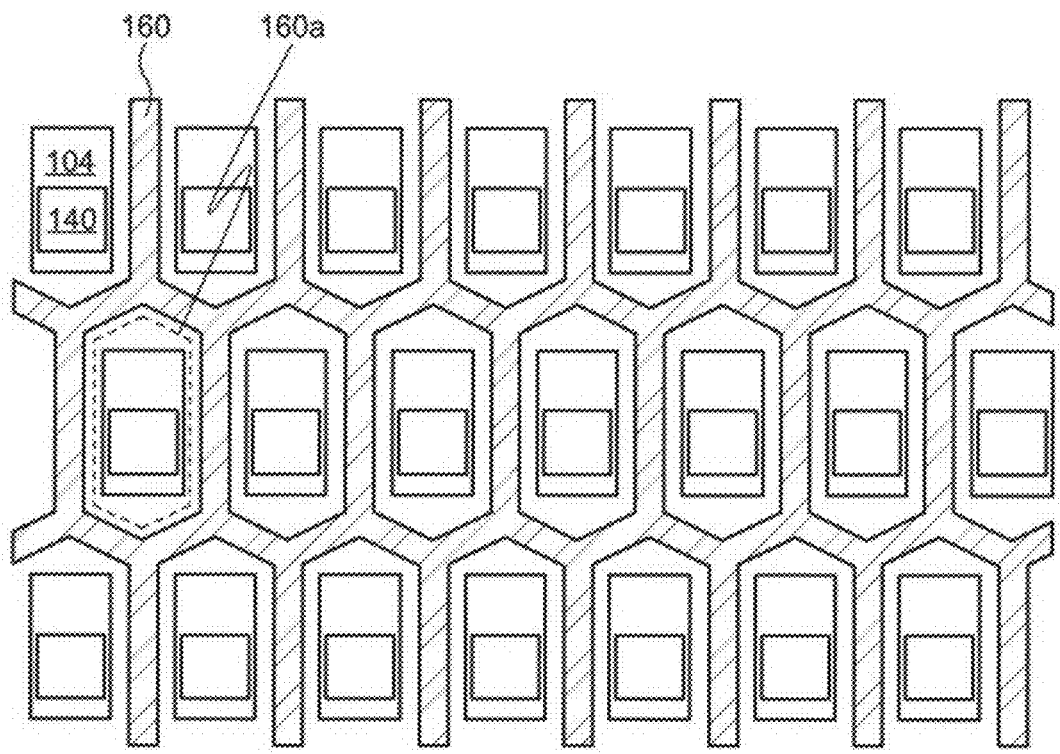

Alternatively, the rib 160 may be configured so that the plurality of openings 160a is arranged in a honeycomb shape as shown in FIG. 6B. In this case, the Delta arrangement can be applied to the pixels 104.

Figure 7A:
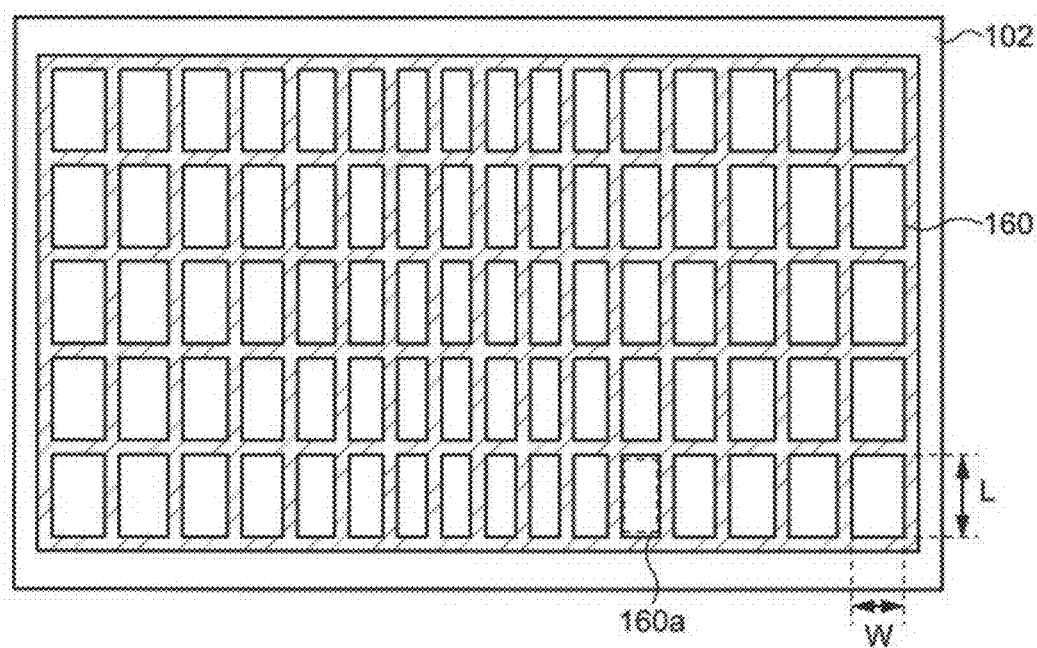
FIG. 7A and FIG. 7B are schematic top views of a display device according to an embodiment of the present invention.
Figure 7B:
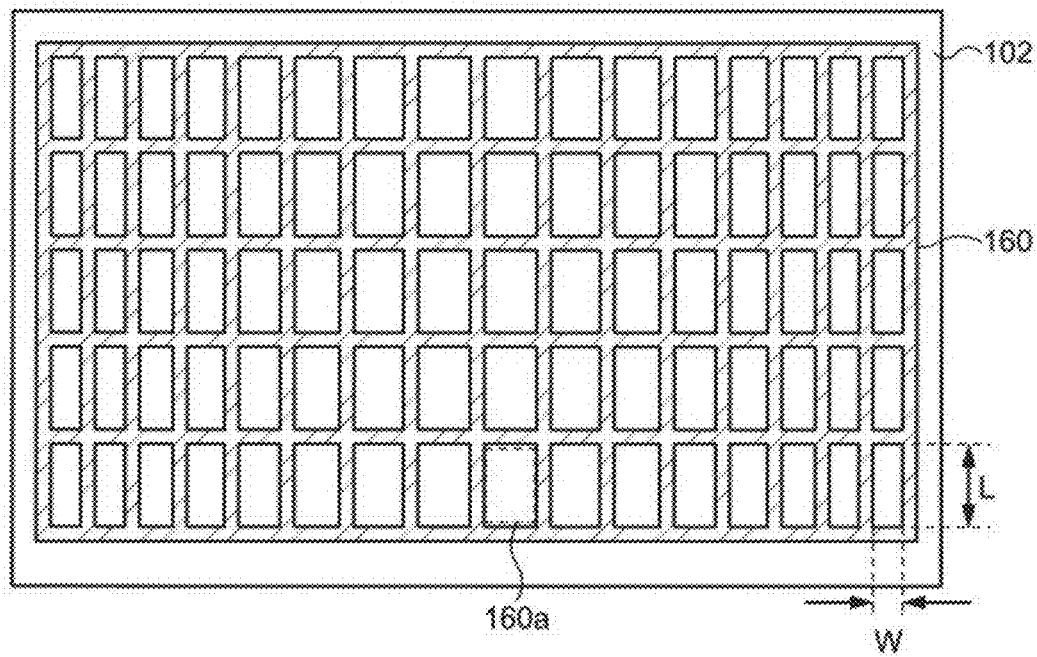

When the rib 160 has a plurality of openings 160a (see FIG. 3A), the areas, the lengths L, or the widths W may be constant in the whole of the display device 100 as described above or may be different from one another between the center and a vicinity of the edge portion of the substrate 102. For example, the width W or the length L of the opening 160a at the center of the substrate 102 may be smaller than that on the side of the edge portion of the substrate 102 as shown in FIG. 7A. Alternatively, the width W or the length L of the opening 160a at the center of the substrate 102 may be larger than that on the side of the edge portion of the substrate 102 as shown in FIG. 7B. Moreover, the width W or the length L may increase or decrease continuously or stepwise in a direction toward the edge portion from the center of the substrate 102. The density of the ribs 160 can be varied in the display region 106 by employing such a structure.

Although not illustrated, when the plurality of openings 160a arranged in a stripe form or an island form is provided to the display device 100, the distance between the adjacent ribs 160 may be different between the center and the vicinity of the edge portion of the substrate 102, and the ribs 160 may be configured so that the distance increases or decreases continuously or stepwise in a direction toward the edge portion from the center of the substrate 102.

Figure 3B:
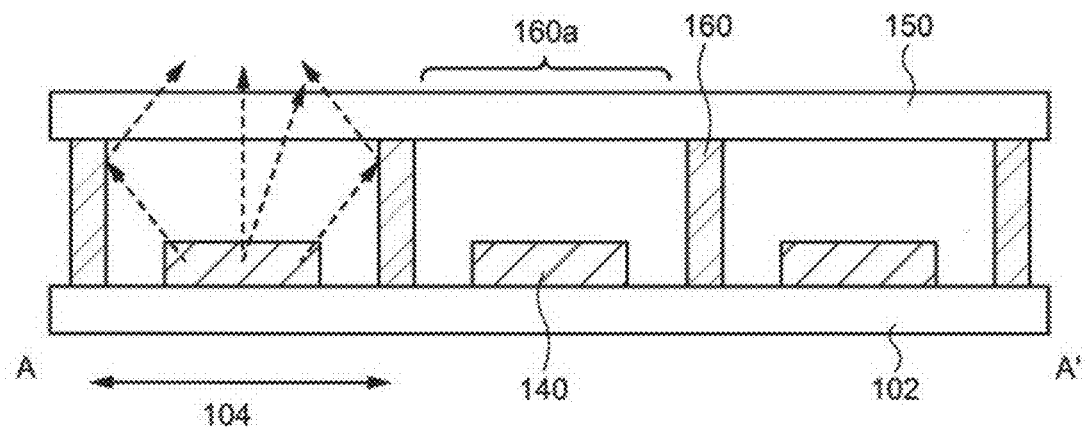
Figure 8A:
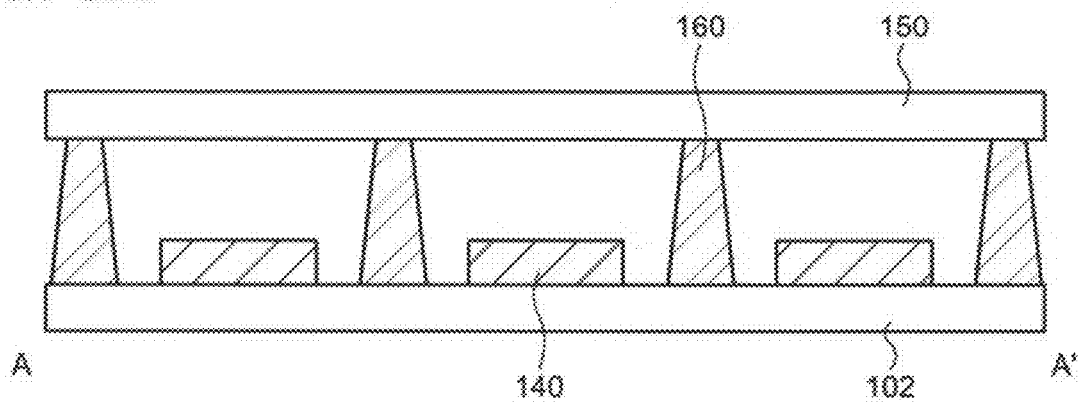
FIG. 8A to FIG. 8C are schematic cross-sectional views of a display device according to an embodiment of the present invention.
Figure 8B:
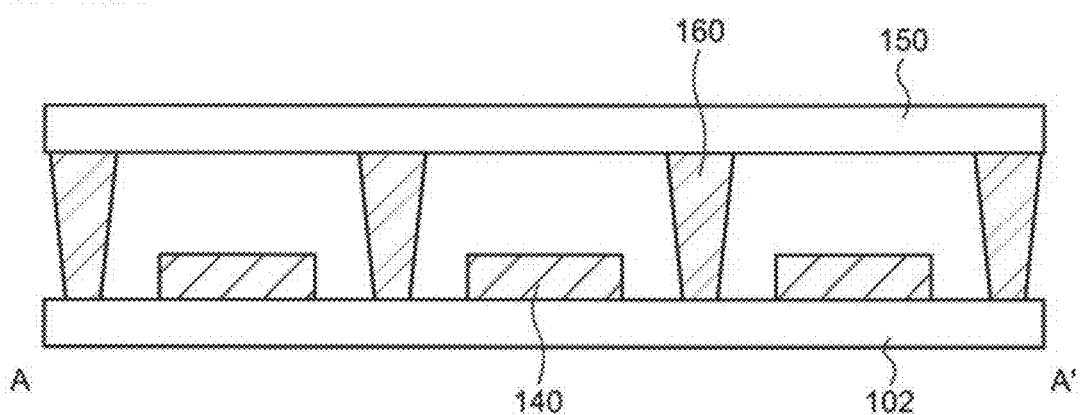
Figure 8C:
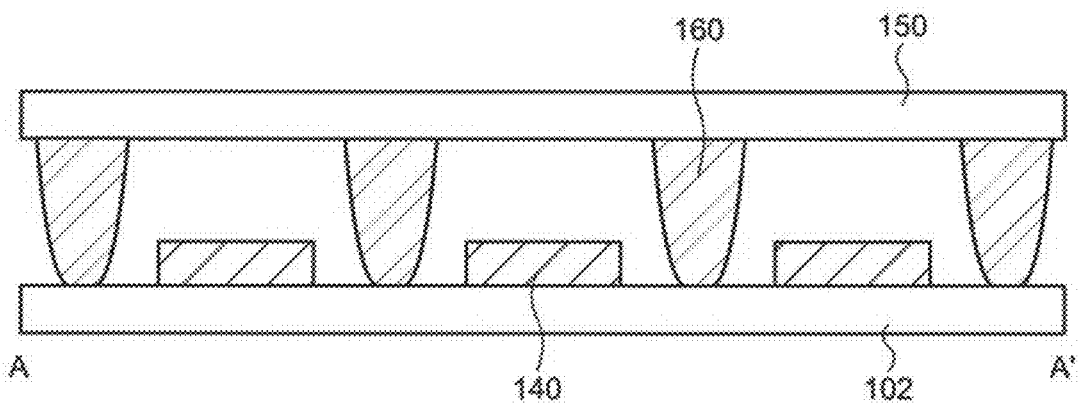

There is also no limitation to a cross-sectional shape of the rib 106, that is, a shape in a cross section perpendicular to the main surface of the substrate 102. For example, the rib 106 may be configured so that the cross-sectional shape has a constant or substantially constant width between the substrate 102 and the counter substrate 1050 as shown in FIG. 3B or the width decreases (FIG. 8A) or increases (FIG. 8B) in a direction toward the counter substrate 150 from the substrate 102. Alternatively, the rib 160 may be configured so that an outline of the cross section has a curve as shown in FIG. 8C.

5. Other Structures

Figure 10:
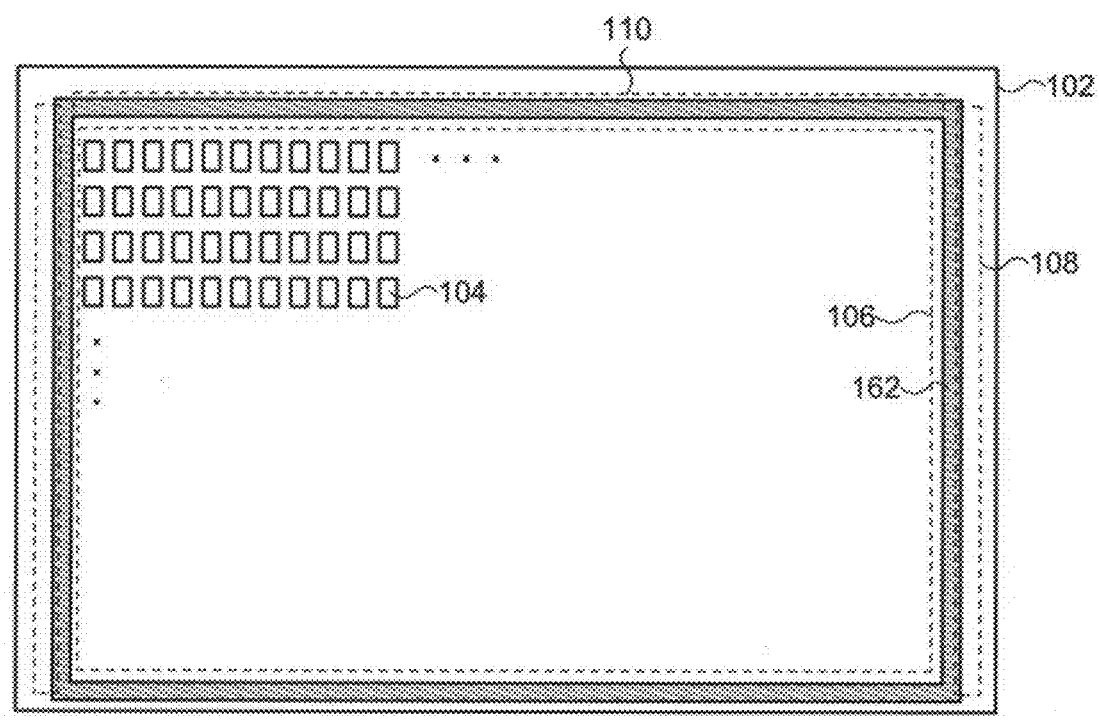
FIG. 10 is a schematic top view of a display device according to an embodiment of the present invention.

As shown in FIG. 9A, the display device 100 may include a sealer 162 as an optional structure. The sealer 162 fixes the substrate 102 and the counter substrate 150, has a function to seal a space therebetween, and includes a resin such as an epoxy resin and an acrylic resin. An inert gas such as nitrogen and argon or air is encapsulated in the space. The formation of the sealer 162 prevents oxygen or water from entering the display device 100 from the outside, thereby further improving reliability of the display device 100. The sealer 162 is formed to surround the display region 106 (FIG. 10). That is, the sealer 162 may be provided to surround the plurality of pixels 104, the LEDs 140 arranged therein, and the rib 160. The sealer 162 may be formed to overlap one or both of the scanning-line driver circuit 108 and the signal-line driver circuit 110.

When the sealer 162 is provided, the rib 160 may be formed so as to be spaced away from the substrate 102 (FIG. 9B). When the variety of insulating films (e.g., the passivation film 120, first interlayer insulating film 122, the second interlayer insulating film 124, the protective insulating film 130, and the like shown in FIG. 2A and FIG. 2B) is provided, the rib 160 may be formed to be spaced away from the insulating film closest to the counter substrate 150 among these insulating films (hereinafter, this insulating film is referred to as an uppermost insulating film). In this case, the distance between the substrate 102 and the counter substrate 150 is maintained and fixed by the sealer 162. With such a structure, no strain arises in the rib 160, and destruction of the rib 160 and unfavorable influences on the display device 100 caused by the destruction can be prevented when the substrate 102 and the counter substrate 150 are bent as described below, Alternatively, a filler 164 may be formed between the substrate 102 and the counter substrate 150 as shown in FIG. 9C. The filler 164 fixes the substrate 102 and the counter substrate 150, covers the LEDs 140, and has a function as a protective film preventing the entrance of oxygen or water from the outside. Although not illustrated, the sealer 162 as well as the filler 164 may be provided. A material having high transmissivity with respect to visible light is preferred as a material included in the filler 164, and a polymer such as an acrylic resin, an epoxy resin, a polycarbonate, and a polyester is represented, for example. The material structuring the filler 164 is preferably selected so that a refractive index of the filler 164 is smaller than the refractive index of the rib 160. Although not illustrated, a desiccant such as zeolite and silica gel or light-diffusing particles including titanium oxide or the like may be mixed with the filler 164.

Figure 11A:
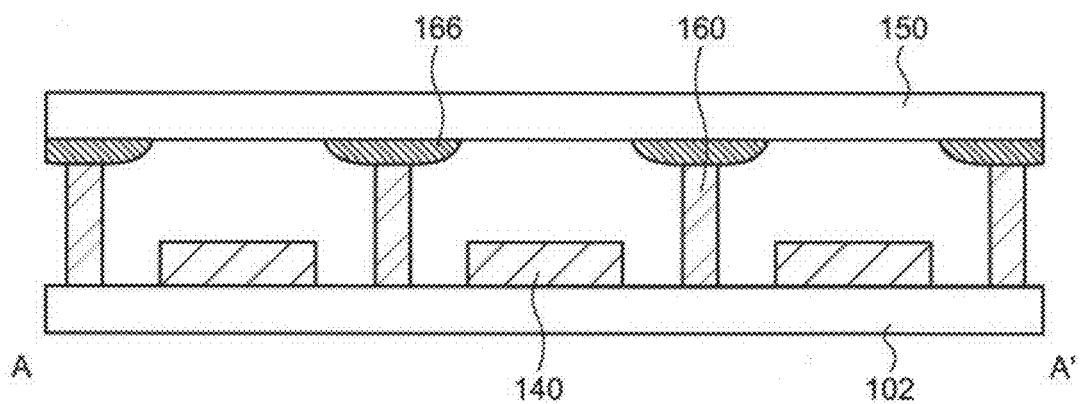
FIG. 11A and FIG. 11B are schematic cross-sectional views of a display device according to an embodiment of the present invention.

Alternatively, the display device 100 may further include the light-shielding film (black matrix) 166 overlapping the rib 160 between the rib 160 and the counter substrate 150 as shown in FIG. 11A. The light-shielding film 166 includes a material with a low light-transmitting property with respect to visible light. For example, the light-shielding film 166 may include a metal with a relatively low light reflectance, such as chromium and molybdenum, or a mixture containing a resin material and a coloring agent of black or an equivalent color. The rib 160 and the light-shielding film 166 may be in direct contact with each other, or an overcoat which is not illustrated may be interposed between the rib 160 and the light-shielding film 166.

Figure 11B:
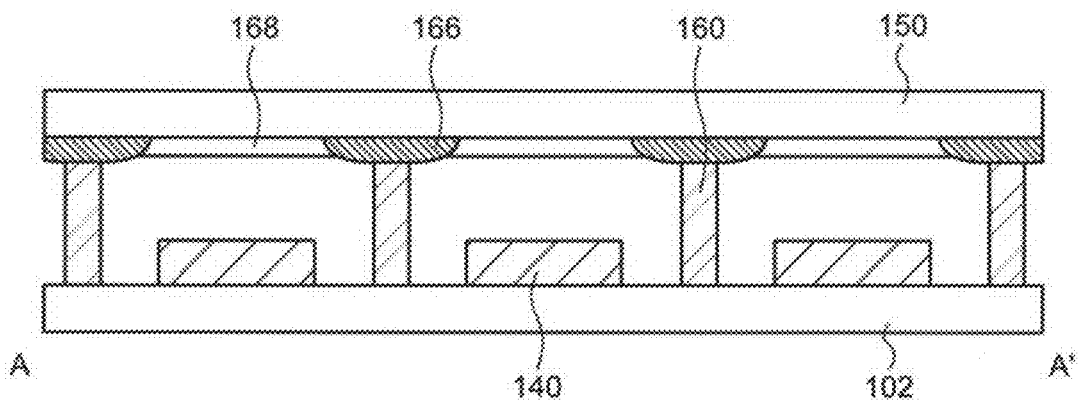

Alternatively, color filters 168 overlapping the LEDs 140 may be disposed in the display device 100 so as to overlap all of or a part of the pixels 104 as shown in FIG. 11B. With this structure, color purity of the light emitted from the LEDs 140 can be improved.

As described above, a part of the light emitted from the LEDs 140 reflects on the surface of the rib 160, allowing the reflected light to be condensed on the side of the counter substrate 150 in the display device 100 according to the present embodiment. Therefore, the apparent emission efficiency of the LEDs 140 increases, and images can be supplied at higher luminance. Hence, it is possible to produce a display device with low power consumption and further improve reliability thereof because the amount of the current required to display images can be reduced.

Second Embodiment

In the present embodiment, a structure of a display device 200 configured so that all of or a part of the light from the LEDs 140 arranged in the plurality of pixels 104 is extracted through the substrate 102 is explained. An explanation of the structures the same as or similar to those described in the First Embodiment may be omitted.

The display device 200 shown by a cross-sectional view in FIG. 12A is different from the display device 100 in that a reflecting film 170 is further provided between the LEDs 140 and the counter substrate 150. The reflecting film 170 is formed to overlap the LEDs 140. The reflecting film 170 may be sandwiched by the rib 160 and the counter substrate 150 as shown in FIG. 12A or may be selectively disposed between the adjacent ribs 160 as shown in FIG. 12B. Moreover, the reflecting film 170 may be formed to further cover the whole of or part of the side wall of the rib 160 as shown in FIG. 12C.

The reflecting film 170 is preferred to include a material with a high reflectance with respect to visible light, and aluminum, silver, and an alloy of these metals are represented as such a material. The reflecting film 170 may be a single layer or a stacked layer of films including different metals.

The formation of the reflecting film 170 over all of the pixels 104 allows the light emitted from the LEDs 140 to reflect on the reflecting film 170, by which the emission can be efficiently extracted through the substrate 102 (see dotted arrows in FIG. 12A). Hence, images reproduced on the display region 106 can be supplied through the substrate 102, and a so-called bottom-emission type display device can be structured.

Figure 13A:
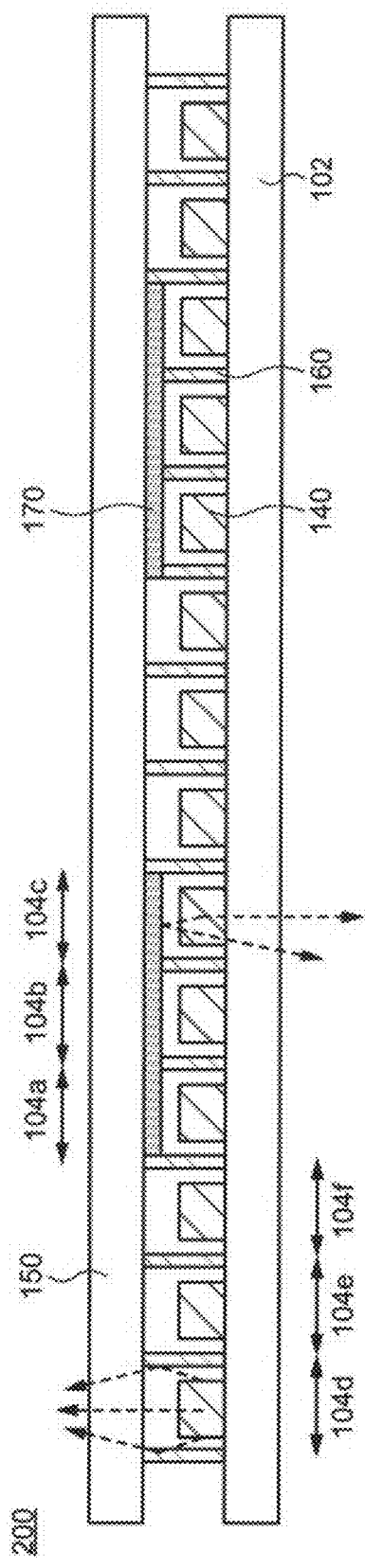
FIG. 13A and FIG. 13B are schematic cross-sectional views of a display device according to an embodiment of the present invention.

The reflecting film 170 may not always be provided to all of the pixels 104 and may be provided to a part of the pixels 104. Specifically, the reflecting film 170 may be provided to only a part of the pixels 104, that is, the pixels 104a to 104c, and may not be provided to other pixels 104d to 104f as shown in FIG. 13A. With this structure, images reproduced by the pixels 104a to 104c can be supplied on the side of the substrate 102, while images reproduced by the pixels 104d to 104f can be supplied on the side of the counter substrate 150. In other words, a so-called dual-emission-type display device can be structured. Hence, it is possible to supply the same images on the sides of the substrate 102 and the counter substrate 150, and it is also possible to simultaneously supply different images from each other.

Figure 13B:
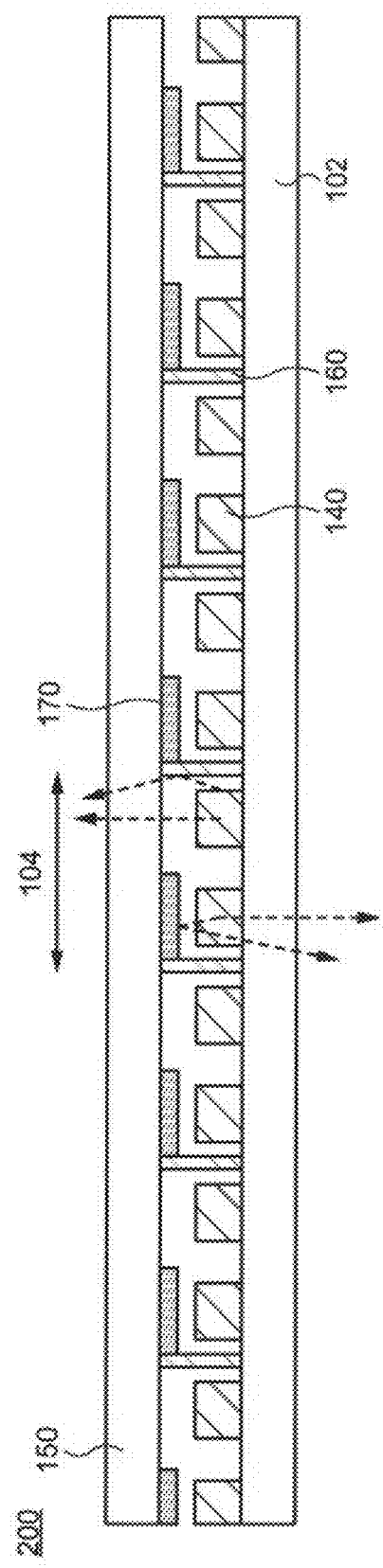

Alternatively, the display device 200 may be configured so that a plurality of LEDs 140 is arranged in each pixel 104, the reflecting film 170 is formed to cover a part of the LEDs 140 in each pixel 104, and the other LEDs 140 are not covered by the reflecting film 170 so as to be exposed from the reflecting film 170 as shown in FIG. 13B. In this case, a light-shielding film or a reflecting film may be disposed between the substrate 102 and the passivation film 120 so as to overlap the LEDs 140 to which the reflective film 170 is not provided. With this structure, images with the same resolution can be supplied to the sides of the substrate 102 and the counter substrate 150.

Similar to the display device 100, a part of the light emitted from the LEDs 140 reflects on the surface of the rib 160 and is extracted from the substrate 102 or the counter substrate 150 in the display device 200. Hence, a display device with high efficiency and low power consumption can be produced. Moreover, in the case of the present embodiment, since the aforementioned micro-LEDs, which are extremely small self-emissive elements, are installed with a narrow pitch so as to be arranged at a high density, it is possible to produce high-resolution images providing no discomfort for both users viewing the display device from the sides of the substrate 102 and the counter substrate 150. Furthermore, when the so-called dual-emission type in which the reflecting film 170 is not formed all over the substrate 102 is employed, high-resolution images can be produced by a transmitting display which allows a user to see a background on the counter substrate 150 side when watching the images from the substrate 102 side and allows a user to see a background on the substrate 102 side when watching the images from the counter substrate 150.

Third Embodiment

In the present embodiment, a display device 202 having a fully or partly bent shape is explained. An explanation of the structures the same as or similar to those described in the First and Second Embodiments may be omitted.

As described in the First Embodiment, since the substrate 102 and the counter substrate 150 may include a polymer, flexibility can be provided to the display device 100 by forming the substrate 102 and the counter substrate 150 including a polymer at an appropriate thickness (e.g., approximately 0.5 mm to 10 mm).

Figure 14A:
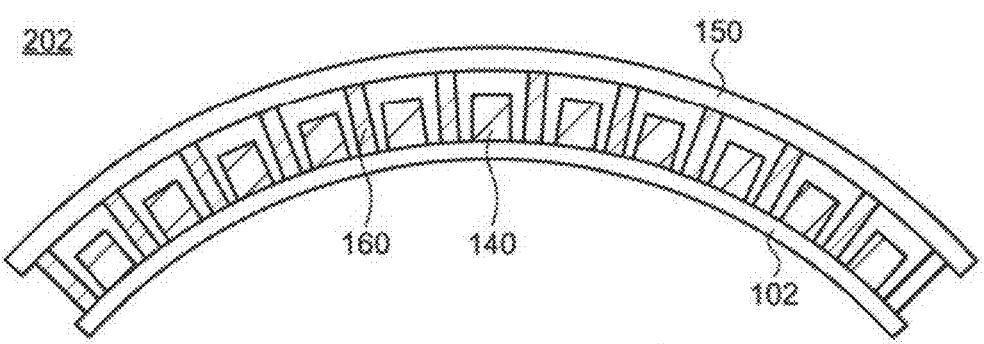
FIG. 14A and FIG. 14B are schematic cross-sectional views of a display device according to an embodiment of the present invention.

Specifically, the substrate 102 and the counter substrate 150 of the display device 202 may have a bent shape as a whole as shown in a schematic cross-sectional view in FIG. 14A. In this case, there is no limitation to curvatures of the substrate 102 and the counter substrate 150. The display device 202 may be bent at a curvature which is the same or substantially the same on the whole device or may be bent to have different curvatures depending on the position. Hence, the curvatures may be determined so as to match a surface shape of an object over which the display device 202 is disposed. Accordingly, it is possible to provide a display function to a surface of an object without considerably affecting the appearance of the object.

Figure 14B:
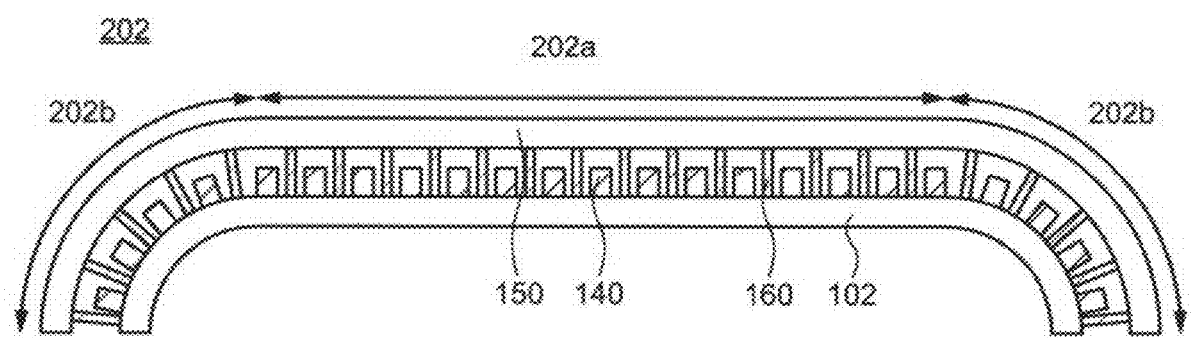

Alternatively, the display device 202 may be partly bent to have a three-dimensional shape having a flat region 202a and a bent region 202b as shown in a schematic cross-sectional view in FIG. 14B. The location where the bent region 202b is formed may be arbitrarily determined. The bent region 202b may be formed at a center portion of the display device 202, or the bent regions 202b may be formed at both edge portions as shown in FIG. 14B.

Figure 15A:
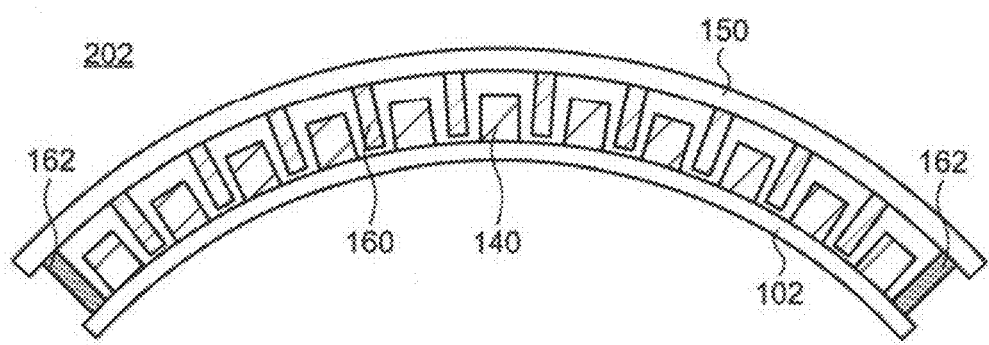
FIG. 15A and FIG. 15B are schematic cross-sectional views of a display device according to an embodiment of the present invention.

Similar to the display device 100, the rib 160 may be formed so that a part of or the whole of the rib 160 is spaced away from the substrate 102 or the uppermost insulating film in the display device 202. For example, the rib 160 may be formed so that the whole of the rib 160 is spaced away from the substrate 102 or the uppermost insulating film as shown in FIG. 15A. In this case, the sealer 162 is preferably disposed so as to surround the rib 160 in order to prevent the entrance of oxygen or water from the outside to the space between the substrate 102 and the counter substrate 150. When a part of the display device 202 has a bent structure (FIG. 15B), the rib 160 may be configured so as to be spaced away from the substrate 102 or the uppermost insulating film only in the bent region 202b.

Figure 15B:
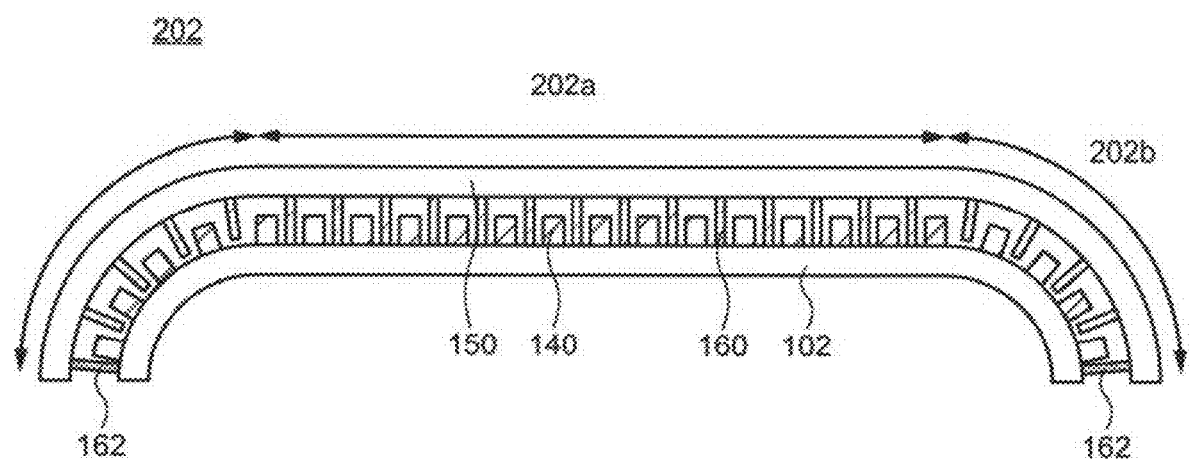

When a part of or the whole of the display device 202 is bent so that the substrate 102 is arranged inside with respect to the counter substrate 150 as shown in FIG. 15A and FIG. 15B, the bend of the substrate 102 simultaneously applies tensile force to the counter substrate 150, and the counter substrate 150 is stretched. Furthermore, the rib 160 is formed to be in direct contact with the counter substrate 150 or in contact with the structural member closest to the substrate 102 among the structural members disposed over the counter substrate 150 as described above. Hence, when the rib 160 is fixed to the substrate 102 or the uppermost insulating film, the stretch of the counter substrate 150 generates strain in the rib 160, which may lead to destruction of the rib 160, the structural member in contact with the rib 160, or the uppermost insulating layer. On the other hand, it is possible to avoid the adverse influence on the display device 202 by forming the rib 160 so as not to be in contact with the substrate 102 or the uppermost insulating film because the strain generation can be prevented in the region to be bent.

Alternatively, when the bent region 202b is formed at the edge portion of the display device 202 (see FIG. 14B), the rib 160 may be configured so that the width W or the length L of the opening 160a or the distance between the adjacent ribs 160 in the flat region 202a is smaller than that in the bent region 202b (see FIG. 7A). Alternatively, the rib 160 may be configured so that the width W or the length L of the opening 160a or the distance between the adjacent ribs 160 increases continuously or stepwise in a direction toward the bent edge portion from the center of the substrate 102. When the rib 160 is configured in this way, the number of pixels 104 overlapping one opening 160a located in the flat region 202a is different from the number of pixels 104 overlapping one opening 160a located in the bent region 202b, and the former is smaller than the latter. The strain generated in the rib 160 can be reduced by structuring the display device 202 in this way even if the rib 160 is fixed to the substrate 102 or the uppermost insulating film.

Fourth Embodiment

In the present embodiment, a manufacturing method of the display devices 100, 200, and 202 is explained. An explanation of the structures the same as or similar to those described in the First to Third Embodiments may be omitted.

1. Substrate

The first wiring 112, the second wiring 114, the leading terminals 126 and 128, the passivation film 120, the first interlayer insulating film 122, the second interlayer insulating film 124, and the protective insulating film 130, which structure the backplane 101 and which are shown in FIG. 2A and FIG. 2B, can be formed by applying the known methods. In addition, since the LEDs 140 may be appropriately arranged over and fixed to the substrate 102 with the known methods, the explanation thereof is omitted.

2. Counter Substrate

Figure 16A:
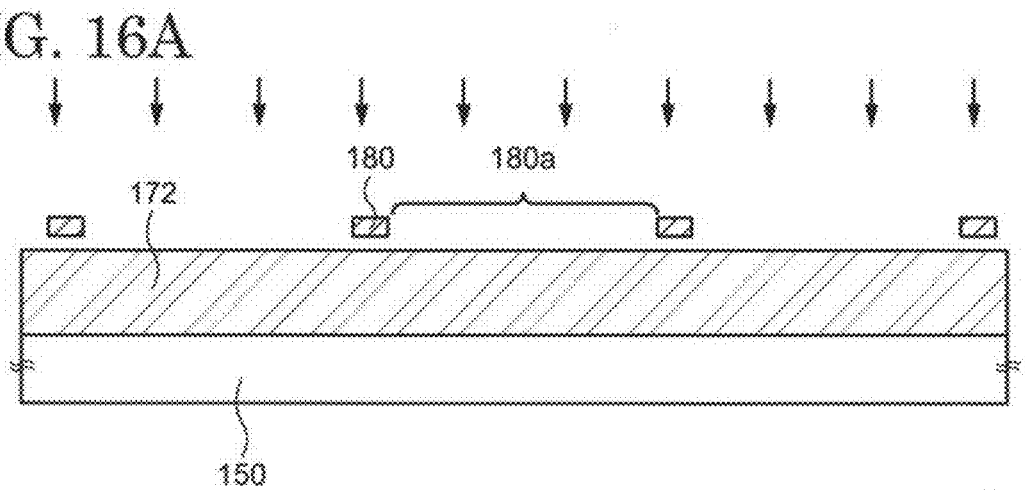
FIG. 16A to FIG. 16D are schematic cross-sectional views for explaining a manufacturing method of a display device according to an embodiment of the present invention.
Figure 16B:
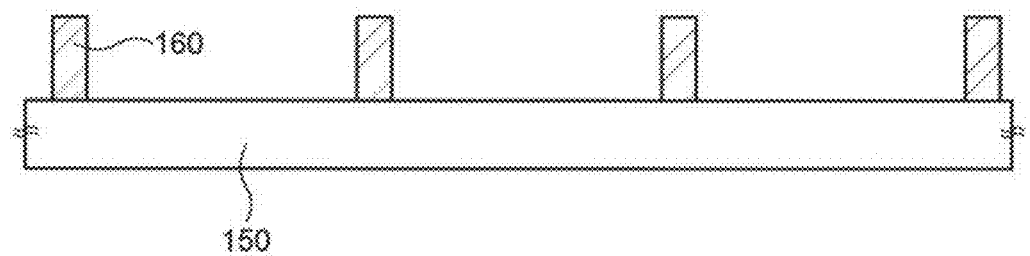

The rib 160 is formed over the counter substrate 150. When the rib 160 includes an organic compound, the rib 160 may be directly formed over the counter substrate 150 using an ink-jet method or a printing method (screen-printing method or a photogravure method). Alternatively, a resin 172 having a photocuring property is applied as an organic compound on the almost entire surface of the counter substrate 150 with an ink-jet method or a printing method, light is applied through a photomask 180 having light-transmitting portions 180a, and then development is conducted to form the rib 160 (FIG. 16A and FIG. 16B). In this case, a film resin having photosensitivity may be adhered to the counter substrate 150 to form the resin 172. Note that the passivation film including a silicon-containing inorganic compound may be formed over the counter substrate 150 before forming the rib 160, and the resin 172 may be formed thereover.

Figure 16C:
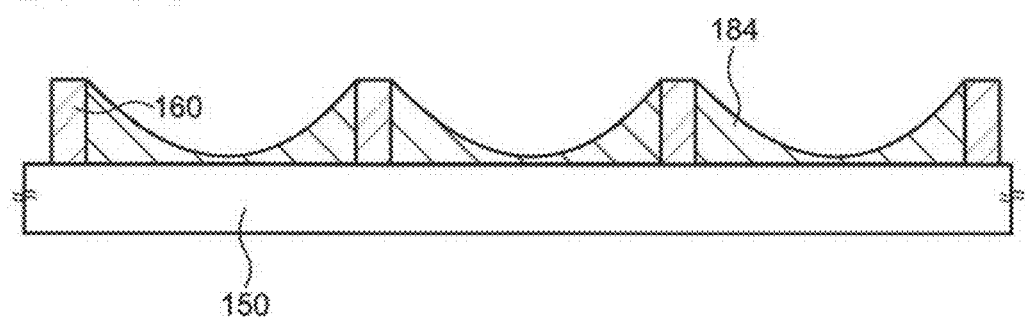
Figure 16D:
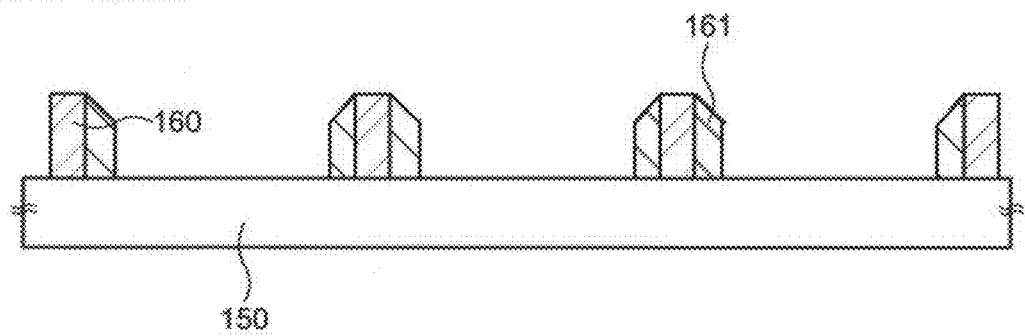

As described above, when the metal film 161 is formed over the wall surface of the rib 160, a metal layer 184 is formed over the counter substrate 150 on which the rib 160 has been formed using a printing method, a spray method, an ink-jet method, or the like, for example (FIG. 16C). At this time, the meal layer 184 is formed so that its thickness increases in a direction toward the rib 160 due to the coffee-cup phenomenon. After that, a resist mask (not illustrated) having openings overlapping the regions between the adjacent ribs 160 is formed, and the metal layer 184 exposed from the resist mask is removed by etching, ashing, or the like, thereby forming the metal film 161 on the wall surface of the rib 160 (FIG. 16D). Alternatively, etching or ashing may be performed on the metal layer 184 without forming the resist mask. In this case, the portions of the metal layer 184 having a small thickness are removed, by which the metal film 161 in contact with the wall surface of the rib 160 can be formed.

Figure 17A:
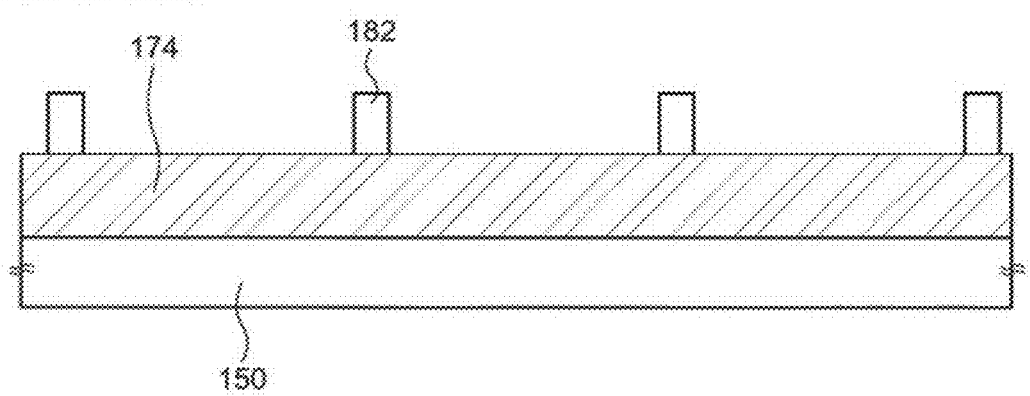
FIG. 17A to FIG. 17D are schematic cross-sectional views for explaining a manufacturing method of a display device according to an embodiment of the present invention.

When the rib 160 includes a metal, a metal layer 174 is formed by bonding a metal plate to the counter substrate 150 or growing a metal film over the counter substrate 150 with an electroplating method, and a resist mask 182 is formed thereover, for example. The rib 160 may be formed by etching or sandblasting this metal layer 174 using the resist mask 182 as a mask, followed by removing the portions uncovered by the resist mask 182 (FIG. 17A).

Figure 17B:
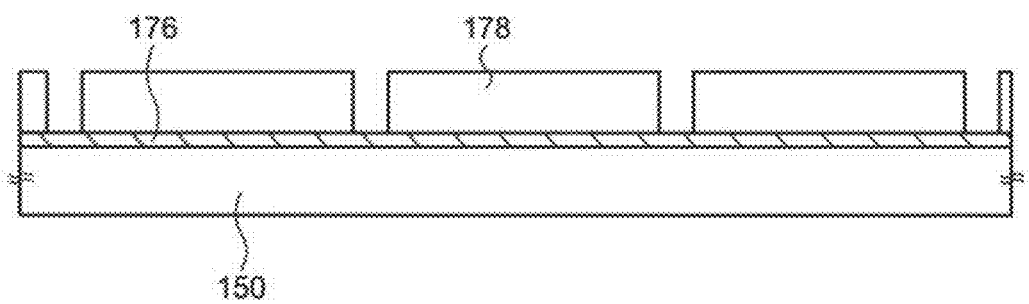
Figure 17C:
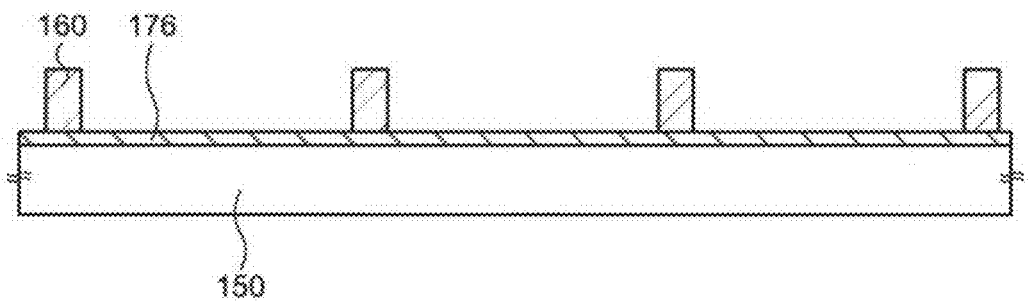
Figure 17D:
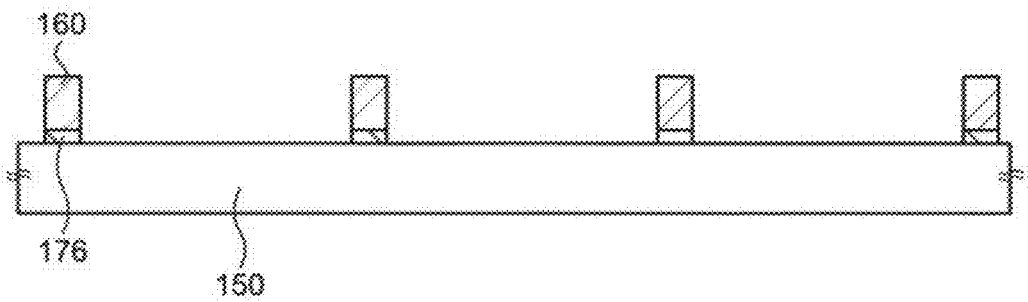

Alternatively, a seed layer 176 is prepared over the counter substrate 150 using a chemical vapor deposition (CVD) method or a sputtering method, and then a mask 178 is formed over the seed layer 176 (FIG. 17B). The seed layer 176 may include a metal such as titanium, nickel, chromium, copper, and gold. After that, current is supplied to the seed layer 176 to form the rib 106 with an electroplating method over the seed layer 176 exposed from the mask 178 (FIG. 17C). Next, the mask 178 is removed, and a part of the rib 160 and the seed layer 176 exposed from the rib 160 are removed by etching or ashing (FIG. 17D). The etching and ashing may be carried out until the counter substrate 150 or the passivation film or the like formed over the counter substrate 150 is exposed. At this time, since the height of the rib 160 formed by electroplating may be decreased, the height of the mask 178 and the height of the rib 160 formed by electroplating may be adjusted in consideration of the decrease in the height during the etching or ashing process.

Figure 18A:
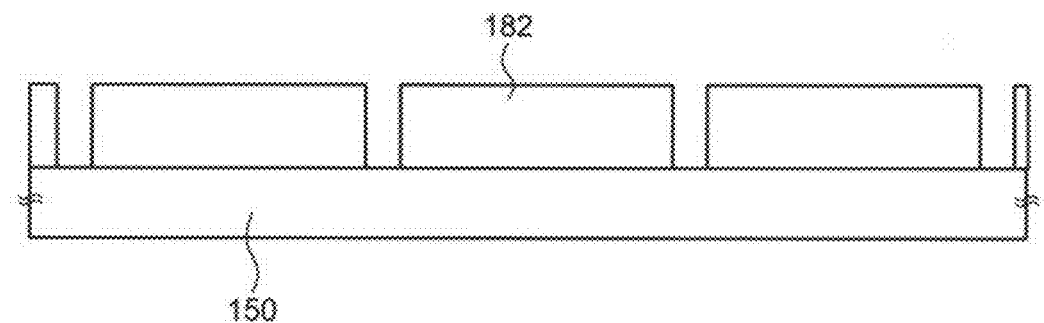
FIG. 18A to FIG. 18C are schematic cross-sectional views for explaining a manufacturing method of a display device according to an embodiment of the present invention.
Figure 18B:
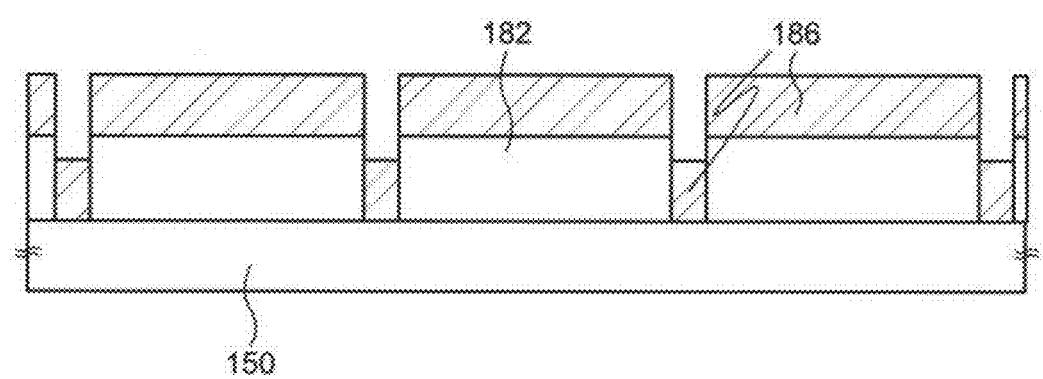
Figure 18C:
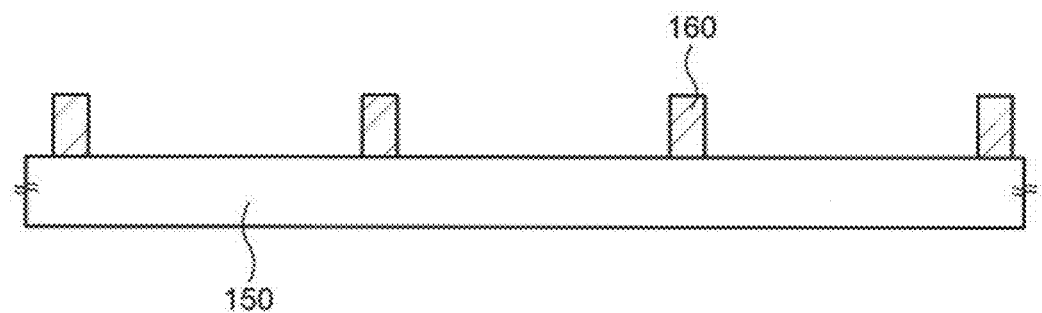

Alternatively, the resist mask 182 having openings overlapping the regions in which the rib is to be formed is formed over the counter substrate 150 as shown in FIG. 18A, and then a metal layer 186 is formed with a CVD method, a sputtering method, an evaporation method, or the like (FIG. 18B). The metal layer 186 is formed so as to fill the openings of the resist mask 182 and overlap the resist mask 182. After that, the resist mask 182 is removed with etching to simultaneously remove the metal layer 186 formed over the resist mask 182 (lift-off). Accordingly, the remaining metal layer 186 is formed as the rib 160 over the counter substrate 150 (FIG. 18C).

In the case where the reflecting film 170 is formed (see FIG. 12A), the metal layer 184 may be formed, with a printing method, a spray method, an ink-jet method or the like, over the counter substrate 150 over which the rib 160 has been formed (FIG. 160), and this metal layer 184 may be directly used as the reflecting film 170. Alternatively, although not illustrated, the reflecting film 170 including a metal may be formed over the counter substrate 150 with a CVD method, a sputtering method, a printing method, an ink-jet method, or the like, the reflecting film 170 may be covered by a resist mask, and the rib 160 may be formed with an electroplating method using the reflecting film 170 as the seed layer 176 (see FIG. 17B and FIG. 17C).

When a material with flexibility is used for the counter substrate 150, the counter substrate 150 is bonded to a supporting substrate (not illustrated) including glass or quartz, or the counter substrate 150 is prepared by applying the resin exemplified in the First Embodiment over the supporting substrate and curing the resin, for example. After that, the supporting substrate is peeled off after forming the rib 160 over the counter substrate 150, by which the counter substrate 150 with flexibility and the rib 160 formed thereover can be obtained.

Figure 19:
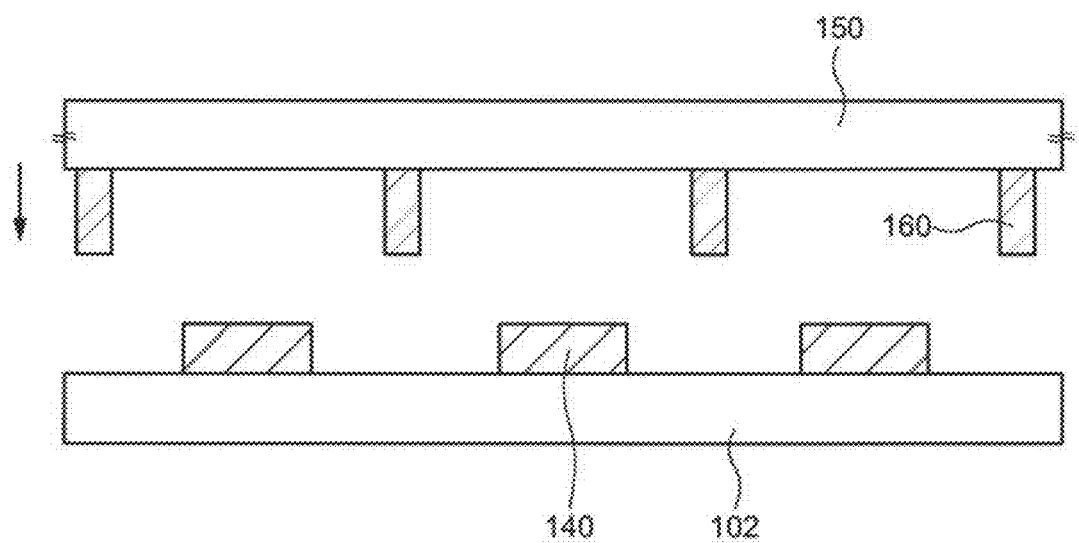
FIG. 19 is a schematic cross-sectional view for explaining a manufacturing method of a display device according to an embodiment of the present invention.

After forming the rib 160, the substrate 102 and the counter substrate 150 are bonded and fixed to each other so that the rib 160 and the LEDs 140 are sandwiched by the substrate 102 and the counter substrate 150 (FIG. 19). When the sealer 162 is provided (see FIG. 9A), the sealer 162 can be formed by arranging a resin with photosensitivity over the substrate 102 or the counter substrate 150, followed by exposing the resin to be cured in a state where the substrate 102 and the counter substrate 150 are bonded. A similar method may be applied in the case where the filler 164 is provided. A resin with photosensitivity may be dropped on the substrate 102 or the counter substrate 150, and the resin may be exposed to be cured in a state where the substrate 102 and the counter substrate 150 are bonded.

Through the processes described above, the display devices 100, 200, and 202 can be manufactured.

As described above, the variety of wirings and insulating films structuring the backplane 101 and the LEDs 140 arranged thereover can be formed and arranged by applying the known methods. Therefore, the display devices 100, 200, and 202 can be manufactured by utilizing existing manufacturing facilities and the known technologies in an embodiment of the present invention. These features contribute to the reduction of the manufacturing cost.

In addition, the rib 160 is not formed over the substrate 102 but is formed over the counter substrate 150, and then the substrate 102 and the counter substrate 150 are fixed. Hence, the forming conditions of the rib 160 does not affect the wirings, the insulating films, and LEDs 140 disposed over the substrate 102 during the formation of the rib 160. In other words, the high degree of freedom in selecting the manufacturing processes is also a characteristic of an embodiment of the present invention because the formation method, conditions, materials, and the like can be selected or set without considering the processes for preparing the backplane 101. Furthermore, the display type (bottom emission or dual emission) can be selected simply by appropriately designing the rib 160 even if the shape and the arrangement of the rib 160 are changed because the backplane 101 can be standardized.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is understood that another effect different from that provided by each of the aforementioned embodiments is achieved by the present invention if the effect is obvious from the description in the specification or readily conceived by persons ordinarily skilled in the art.

What is claimed is:

1. A display device comprising:
   a substrate;
   a plurality of pixels located over the substrate and each including a light-emitting diode;
   a counter substrate over the plurality of pixels; and
   at least one rib provided over the counter substrate and located over a region between the light-emitting diodes included in the plurality of pixels,
   wherein the at least one rib is a columnar member and or wall-shaped member having a height larger than a height of the light-emitting diode,
   the at least one rib has a plurality of openings overlapping the light-emitting diodes of the plurality of pixels,
   a number of the pixels overlapping a first opening selected from the plurality of openings is different from a number of the pixels overlapping a second opening selected from the plurality of openings,
   the substrate is partly bent and has a bent region and a flat region so that a curvature of the bent region is greater than a curvature of the flat region, and the first opening is located in the flat region and the second opening is located in the bent region.

2. The display device according to claim 1, wherein the at least one rib includes an organic compound with a refractive index equal to or higher than 1.40 and equal to or lower than 1.80.

3. The display device according to claim 1, wherein the at least one rib includes a metal.

4. The display device according to claim 1, wherein the at least one rib includes an organic compound and a metal film covering the organic compound.

5. The display device according to claim 1, further comprising a plurality of insulating films located over the substrate and under the at least one rib,
wherein the insulating film closest to the counter substrate among the plurality of insulating films is spaced away from the at least one rib.

6. The display device according to claim 1, wherein the plurality of openings is arranged in a honeycomb form.

7. The display device according to claim 1, wherein the at least one rib includes a plurality of ribs arranged in a stripe form.

8. The display device according to claim 7, wherein the light-emitting diodes included in a part of the plurality of pixels are arranged in a plurality of columns between the adjacent ribs.

9. The display device according to claim 1, further comprising a sealer surrounding the at least one rib and the plurality of pixels between the substrate and the counter substrate.

10. The display device according to claim 1, further comprising a filler covering the light-emitting diodes of the plurality of pixels between the substrate and the counter substrate.

11. The display device according to claim 1, further comprising a reflecting film over the light-emitting diodes of the plurality of pixels.

12. The display device according to claim 1, further comprising a reflecting film over the light-emitting diodes of a part of the plurality of pixels.

13. The display device according to claim 1, further comprising a light-shielding film between the at least one rib and the counter substrate.

14. The display device according to claim 1, wherein the number of the pixels overlapping the first opening is smaller than the number of the pixels overlapping the second opening.

* * * * *